(12) United States Patent  
Igarashi et al.

(10) Patent No.: US 6,596,075 B2
(45) Date of Patent: Jul. 22, 2003

(54) METHOD OF PRODUCING A CRYSTAL SHEET, APPARATUS FOR USE IN PRODUCING THE SAME, AND SOLAR CELL

(75) Inventors: Kazuto Igarashi, Kitakatsuragi-gun (JP); Yoshihiro Tsukuda, Fujiidera (JP); Hidemi Mitsuyasu, Kitakatsuragi-gun (JP); Hokuto Yamatsugu, Kitakatsuragi-gun (JP); Tohru Nunoi, Nara (JP); Hiroshi Taniguchi, Nara (JP); Koji Yoshida, Minamikawachi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/746,811

(22) Filed: Dec. 26, 2000

(65) Prior Publication Data

US 2001/0004874 A1 Jun. 28, 2001

(30) Foreign Application Priority Data

Dec. 27, 1999 (JP) .............................. 11-369299
Dec. 6, 2000 (JP) ........................ 2000-371147

(51) Int. Cl.$^7$ ........................ C30B 15/24; C30B 29/64
(52) U.S. Cl. ............................... 117/26; 117/922
(58) Field of Search ............... 117/11, 41, 42, 117/47, 54, 60, 922, 931, 934, 23, 26

(56) References Cited

U.S. PATENT DOCUMENTS

| 3,648,653 A | * | 3/1972 | Vehse ........................ 118/416 |
| 3,993,533 A | * | 11/1976 | Milnes et al. ................ 156/613 |
| 4,032,370 A | * | 6/1977 | Matare ........................ 148/171 |
| 4,160,682 A | * | 7/1979 | Esseluhn ..................... 148/171 |
| 4,243,472 A | * | 1/1981 | O'Neill ....................... 156/624 |
| 4,251,570 A | | 2/1981 | Zook |
| 4,447,289 A | * | 5/1984 | Geissler et al. ............. 156/608 |
| 4,552,289 A | * | 11/1985 | Wakefield et al. .......... 222/600 |
| 4,647,437 A | * | 3/1987 | Stormont et al. ........... 422/256 |
| 4,727,047 A | * | 2/1988 | Bozler et al. ................ 437/89 |
| 4,778,478 A | * | 10/1988 | Barnett ........................ 437/5 |
| 5,217,564 A | * | 6/1993 | Bozler et al. ........... 156/620.71 |
| 5,544,616 A | * | 8/1996 | Ciszek et al. ................. 117/60 |
| 5,712,199 A | | 1/1998 | Nakagawa et al. |
| 6,231,667 B1 | * | 5/2001 | Iwane et al. .................. 117/55 |

FOREIGN PATENT DOCUMENTS

| EP | 0 253 134 | 1/1988 |
| EP | 0 381 051 | 8/1990 |
| EP | 1 085 559 | 3/2001 |
| JP | 61-275119 | 12/1986 |
| JP | 10-29895 | 2/1998 |

* cited by examiner

Primary Examiner—Benjamin L. Utech
Assistant Examiner—Matthew A. Anderson
(74) Attorney, Agent, or Firm—Nixon & Vanderhye P.C.

(57) ABSTRACT

A high-quality crystal sheet is provided. An apparatus for use in producing a crystal sheet includes a substrate having a main surface on which a crystal sheet is formed, a crucible holding a melt therein, a movable member holding the substrate to move it to bring its main surface into contact with the melt and then move the substrate away from the melt, and cooling means for cooling the movable member.

10 Claims, 29 Drawing Sheets

METHOD OF PRODUCING A CRYSTAL SHEET, APPARATUS FOR USE IN PRODUCING THE SAME, AND SOLAR CELL

BACKGROUND OF THE INVENTION

1. Field of the Invention

The present invention generally relates to methods of and apparatus for use in producing a crystal sheet from a melt of semiconductor or metal, and in particular to methods of and apparatus for use in producing a sheet of silicon to be used as the substrate of a solar cell.

2. Description of the Background Art

Conventionally, a substrate of crystallized silicon is produced by producing an ingot in the Czochralski method or casting a source material to produce an ingot and then slicing the ingot for example with a wire saw. However, the slicing step is costly and cutting a portion results in a loss of the source material of silicon. As such, in the area of solar cell, to address an important issue, i.e., cost reduction, silicon ribbon methods are being increasingly developed. In this method, a sheet of silicon is extracted directly from a melt of silicon to eliminate the necessity of providing a slicing step.

Of such silicon ribbon methods, a method of growing a crystal having a large solidification interface is disclosed for example in Japanese Patent Laying-Open No. 61-275119. FIG. 49 schematically shows a method of producing silicon in the silicon ribbon method disclosed in the document. With reference to FIG. 49, a rotative cooling element 902 in the form of a cylinder has a side surface partially immersed into melted silicon 903, and rotative cooling element 902 is rotated and a silicon ribbon 901 solidified on a cylindrical surface of cooling element 902 is successively extracted. Note that melted silicon 903 is held in a container 904.

Japanese Patent Laying-Open No. 10-29895 also discloses a silicon-ribbon production apparatus. FIG. 50 is a schematic view of the silicon-ribbon production apparatus disclosed in the above publication. As shown in the figure, this apparatus is configured of a rotative cooling element 931 in the form of a cylinder, a container 934 holding melted silicon 932 therein, and a roller 935 guiding a silicon ribbon 933.

Rotative cooling element 931 has an cylindrical side surface partially immersed into melted silicon 932. As rotative cooling element 931 is rotated silicon ribbon 933 solidified and grown on the cylindrical surface of the cooling element is extracted successively.

Furthermore, a crystal sheet can be produced directly from a melt in an EFG (Edge-defined Film-fed Growth) method, in which a die having an opening in the form of a slit is used to raise a melt through capillarity and at an upper end of the melt a seed crystal is used to extract a silicon ribbon. A crystal sheet can also be produced in the Dendrite Web method, in which a melt has a surface supercooled to produce a crystal sheet.

In methods using a rotative cooling element in the form of a cylinder, however, silicon solidifies and grows to cover an exterior of the cylinder and silicon that is grown thus has a curvature along the cylinder and thus curves. Such silicon is inconvenient if it is used as a substrate of a solar cell as the substrate is required to be flat in a process step such as screen-printing an electrode, laminating, vacuum-chucking and the like. Furthermore, a conventional substrate tray provided to be suitable for a flat substrate, cannot be used. Furthermore, when grown silicon removed from a rotative cooling element is extracted successively in a predetermined direction it needs to be pulled in the direction with tensile strength precisely controlled. Furthermore, the sheet of grown, crystallized silicon warping in geometry is hardly pulled successively in one direction.

Furthermore, in the EFG method and the Dendrite Web method, a crystal sheet is grown at a rate significantly affected by heat of solidification generated and heat transfer determined by a temperature profile in a vicinity of a solid-liquid interface between the crystal sheet and the melt. As such, successively and reliably producing a crystal sheet entails precisely controlling the temperature of the solid-liquid interface and the temperature profile in the vicinity thereof. Current temperature controlling systems, however, would not satisfactorily respond in proportion to crystal-growth rate in general. Furthermore, in the above methods a crystal sheet that is being grown is cooled by annealing or through natural heat liberation. As a result, the crystal sheet is disadvantageously required to grow at a reduced rate.

Furthermore, when a silicon ribbon is removed from the rotative cooling element the exact silicon ribbon pulls and thus removes the subsequent silicon ribbon from the rotative cooling element. As such, an enormous load is imposed on the silicon ribbon and thus tends to damage the silicon ribbon. Furthermore, if a silicon ribbon is damaged extracting it can not immediately be resumed and it can thus hardly be reliably successively extracted.

Furthermore, in the conventional methods, it is difficult to control an in-plane temperature profile of a crystal sheet and it is thus necessary to consider thermal conductivity and the like in selecting a material for a substrate and a member therearound and also to optimize a heating portion such as a heater or a cooling portion in arrangement and geometry. In selecting a member, however, not only its thermal conductivity but its wettability and removability with respect to a crystal sheet, coefficient of thermal expansion matched, refractoriness and durability as well as cost need to be considered. As such, the temperature profile can hardly be optimized. Furthermore, it is often difficult technically as well as mechanically to optimize the heating portion and the cooling portion for both of the quality of the crystal of the crystal sheet and the removability thereof. In particular, removability is a parameter significantly depending on the material(s) of the substrate and precise control can thus hardly be achieved. As such, it is difficult to produce a crystal sheet of high quality successively and reliably.

SUMMARY OF THE INVENTION

The present invention has been made to overcome such disadvantages as described above. The present invention contemplates a method of manufacturing a crystal sheet capable of reliably, successively extracting a crystal sheet, an apparatus for use in manufacturing the same, and a solar cell employing the crystal sheet.

The present invention also contemplates a method capable of producing a crystal sheet of high quality, an apparatus for use in manufacturing the same, and a solar cell employing the crystal sheet.

The present invention provides an apparatus for use in producing a crystal sheet including: a plate having a main surface on which a crystal sheet is to be formed; a container holding a melt therein; a movable member holding the plate to bring the main surface of the plate into contact with the melt and then move the plate away from the melt; and cooling means for cooling the movable member.

In the apparatus thus configured a crystal sheet is formed on a main surface of a plate held by a movable member cooled by a cooling means. As such, the crystal sheet formed on the main surface of the plate can be cooled via the movable member with an optimal rate to provide a crystal sheet of high quality. Furthermore, the crystal sheet formed on the main surface of the plate can be free of warpage and it can thus be produced with high quality.

Furthermore, preferably, the apparatus for use in producing a crystal sheet further includes a removal means removing a crystal sheet from the main surface of the plate transported from the movable member. The plate is provided with a throughhole and the removal means has a first protrusion fit into the throughhole.

As such, the first protrusion of the removal means can be fit into the throughhole of the plate to remove the crystal sheet from the plate.

Furthermore, preferably, the movable member has a second protrusion fit into the throughhole of the plate. As such, if a crystal sheet is grown on the main surface with the throughhole receiving the second protrusion, any crystal is not formed in the throughhole. As such, the throughhole can be used to facilitate removing the crystal sheet from the main surface of the substrate.

Furthermore, preferably, the second protrusion has a top surface substantially level with the height of the main surface when the second protrusion is fit into the throughhole. As such, there can be produced a crystal sheet having a flat surface.

Still preferably, the first protrusion is larger in length than the second protrusion. This can ensure that a crystal sheet grown on the plate can be removed by the first protrusion Furthermore, preferably, the plate and the second protrusion are formed of different materials. For example, the plate can be formed of a material allowing a crystal sheet to be readily removed therefrom and the second protrusion can be formed of a material allowing the crystal sheet to be readily grown thereon so as to readily remove the crystal sheet from the plate.

Furthermore, preferably, the removal means is provided with the first protrusion in a direction in which the plate moves and the movable member is provided with the second protrusion in a direction in which the plate moves. As such, rotating the movable member and the removal means to fit the first and second protrusions into throughholes allows a crystal sheet to be produced efficiently Furthermore, preferably, the apparatus for use in producing a crystal sheet further includes a guiding member in the form of a belt guiding the plate from the movable member to the removal means. The guiding member connects a plurality of plates in the form of a caterpillar. As such, the guiding member can successively guide the plates to efficiently produce a crystal sheet. Furthermore, the guiding member connected to form a caterpillar allows repetitive growth and removal of crystal sheets Furthermore, preferably, the plate has opposite ends each provided with a raised portion provided with a connection for connecting adjacent plates to the guiding member.

Furthermore, preferably, the apparatus for use in producing a crystal sheet further includes a guiding member in the form of a rail guiding the plate from the movable member to the removal means. The guiding member in the form of a rail allows the plate to be transported from the movable member to the removal means to efficiently produce a crystal sheet. Since the guiding member is provided in the form of a rail, the plate moving thereon can be moved smoothly.

Furthermore, preferably, the movable member is provided in the form of a polygonal prism. As such, the polygonal prism can have each plane brought into contact with each substrate to efficiently produce a crystal sheet.

Furthermore, preferably, the movable member and the plate are unleveled to allow them to be fit into each other. As such, the movable member and the plate can contact with each other over an increased area and the movable member can thus efficiently cool the plate.

Furthermore, preferably, the main surface of the plate is flat. As such, there can be produced a crystal sheet having a flat surface.

Furthermore, preferably, the main surface of the plate is unleveled. As such, there can be produced a crystal sheet having an unleveled surface.

Furthermore, preferably, the cooling means is provided internal to the movable member. As such, the apparatus can be miniaturized and the cooling means can also efficiently cool the movable member.

The present invention provides the method of producing a crystal sheet including the steps of: bringing a main surface of a cooled plate into a melt; moving away from the melt the main surface of the plate brought into contact with the melt, to solidify the melt on the main surface to grow a crystal sheet on the main surface; and removing the crystal sheet from the plate.

In the method thus configured a crystal sheet is solidified and grown on a main surface of a plate. This can facilitate controlling the temperature at the main surface of the plate to produce a crystal sheet of high quality. Since a crystal sheet is grown on the plate it does not have curvature and a crystal sheet in the form of a plate can thus be readily produced Furthermore, preferably, the step of removing includes guiding a crystal sheet grown on the plate to output the sheet from a heating chamber and thus remove and collect the sheet.

Furthermore, preferably, the step of moving includes using a movable member to bring the main surface of the plate into contact with the melt and then move the plate away from the melt.

Furthermore, preferably, the step of bring includes bringing into contact with the melt the plate provided with a throughhole and the step of removing includes using a removal means provided with a first protrusion to be inserted into the throughhole of the plate from a side of the plate opposite to the main surface of the plate with a crystal sheet thereon to remove the crystal sheet from the plate. As such, the throughhole can receive the first protrusion to facilitate removing the crystal sheet from the plate.

Furthermore, preferably, the removal means is rotatable, the removal means is provided with more than one first protrusion in a direction in which the removal means rotates, and the step of removing includes rotating the removal means to fit more than one first protrusion into at least one throughhole of each of more than one plate to remove the crystal sheet from the plate. As such, the removal means that rotates can successively fit the first protrusion into the throughhole to efficiently remove the crystal sheet from the plate.

Furthermore, preferably, the step of bringing includes using the movable member provided with a second protrusion to bring the plate into contact with the melt with the movable member having the second protrusion fit into the throughhole. Since the plate is brought into contact with the melt with the second protrusion fit into the throughhole, the melt does not enter the throughhole and any crystal sheet is thus not formed in the throughhole. As such, a crystal sheet can be readily removed.

Furthermore, preferably, the movable member is rotatable, the movable member is provided with more than one second protrusion in a direction in which the movable member rotates, and the step of bringing includes rotating the movable member to fit each of more than one second protrusion into each throughhole of more than one plate to bring the plate into contact with the melt As such the movable member can be rotated to fit each of the second protrusions into a throughhole to efficiently bring the plate into contact with the melt Furthermore, preferably, the step of moving includes solidifying a melt of silicon and thus growing a sheet of crystallized silicon.

Still preferably, a solar cell in accordance with the present invention is fabricated with a crystal sheet manufactured in any of the methods as described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
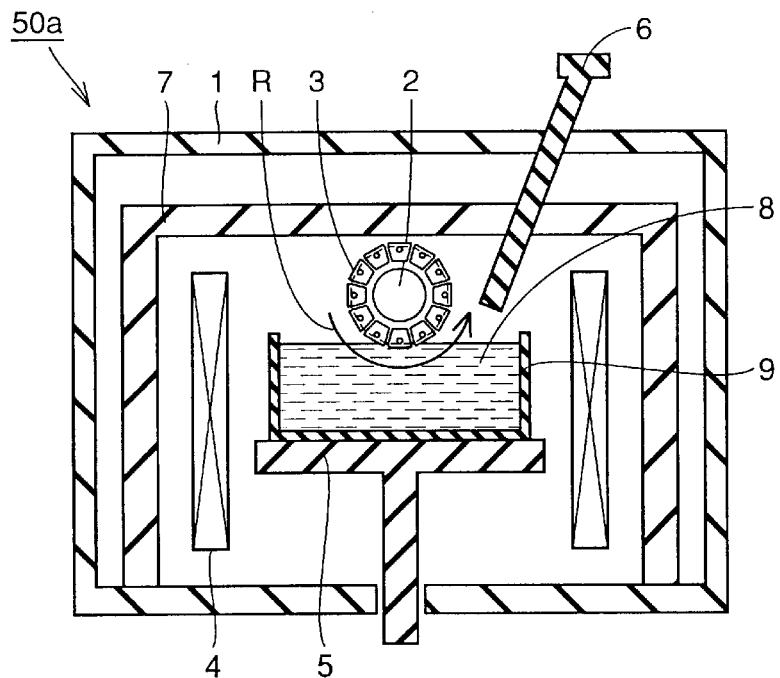
FIG. 1 is a schematic cross section of a crystal sheet production apparatus in a first embodiment of the present invention.

With reference to FIG. 1, a first embodiment of the present invention provides a crystal sheet production apparatus 50a including a main chamber 1, a heat insulator 7 provided internal to main chamber 1, a movable member 2 provided inner than insulator 7, a substrate in the form of a plate, a heater 4, a platform 5 on which a crucible is placed, a port 6 introducing a source material, a melt 8, and a crucible 9 serving as a container holding melt 8 therein.

In the present embodiment, with substrate 3 formed of graphite and melt 8 of silicon the crystal sheet production apparatus is used to produce a silicon sheet, as described hereinafter.

In crystal sheet production apparatus 50a, substrate 3 in the form of a plate has a main surface on which a crystal sheet is to be formed. Crucible 9 serving as a container holds melt 8 therein. Movable member 2 holds substrate 3 to bring the substrate's main surface into contact with melt 8 and then move substrate 3 away from melt 8. Cooling means (not shown in FIG. 1) cools movable member 2.

Internal to main chamber 1 is provided a heating chamber formed of insulator. Heater 4 employing resistance-heating can heat a source material in crucible 9 to the melting point or more. Crucible 9 is provided on platform 5 provided with an elevating mechanism. Since the source material of silicon that is melted reduces in volume, port 6 is used to additionally introduce the source material to adjust the liquid level. Movable member 2 is rotatable in the direction indicated by an arrow R.

Figure 2:
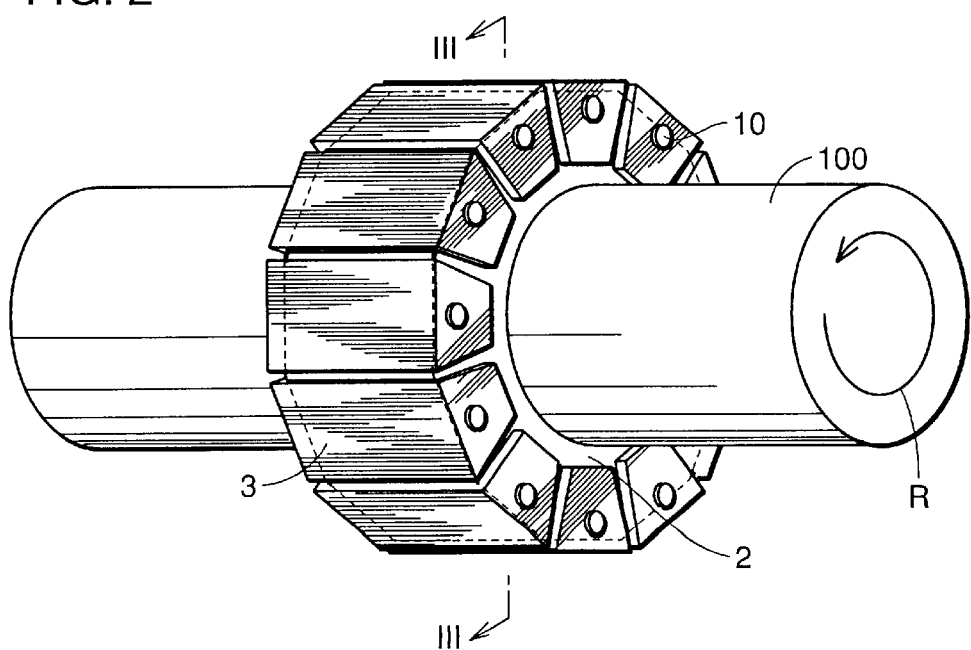
FIG. 2 is an enlarged perspective view of a movable member.

With reference to FIG. 2, movable member 2 is provided in the form of a prism having twelve angles as seen in a cross section. Horseshoe substrate 3 of 5 mm in thickness is provided in contact with movable member 2. Substrate 3 has a side fixed to movable member 2 by a bolt 10. Movable member 2 is fixed to a shaft 100 rotatable in direction R.

Figure 3:
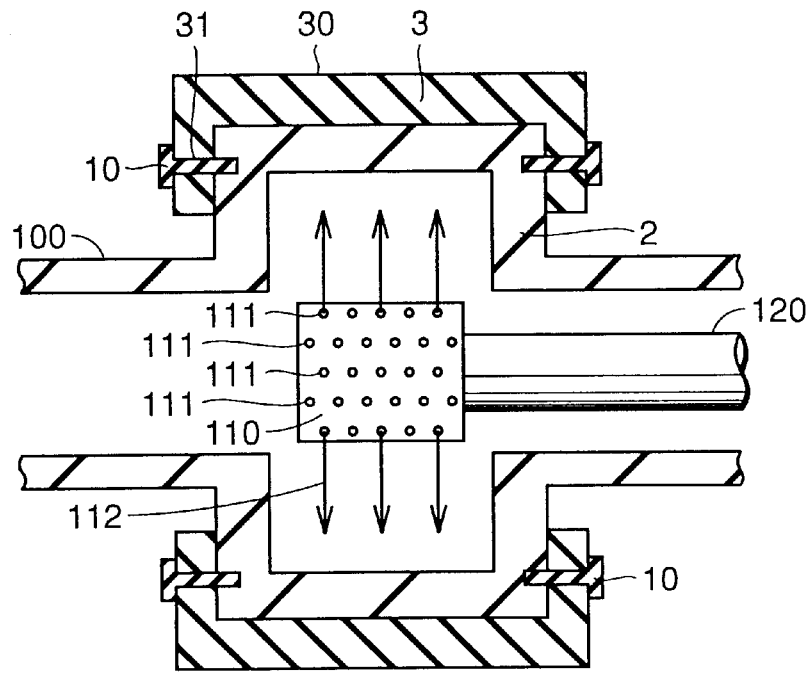
FIG. 3 is a cross section as seen along the III—III line of FIG. 2.

With reference to FIG. 3, movable member 2 is internally provided with a nozzle 110 serving as a cooling means for cooling movable member 2. Movable member 2 has a hollowed structure, as shown in FIG. 3, with nozzle 110 provided therein. Nozzle 110 has a hole 111 through which a cooling gas is sprayed in the direction indicated by an arrow 112 and it is thus sprayed inside movable member 2 to cool movable member 2. Substrate 3 has a throughhole 31 into which bolt 10 is inserted to fix substrate 3, having the main surface, to movable member 2.

While melt 8 in the present embodiment is formed of silicon, it may be a melt of semiconductor or metal of germanium (Ge), gallium (Ga), arsenic (As), indium (In), phosphorus (P), boron (B), antimony (Sb), zinc (Zn) and tin (Sn). More specifically, a crystal sheet can also be grown from the above elements by controlling the temperature of substrate 3 to sufficiently supercool the melt relative to the melting point of each element to produce primary crystal on the substrate 3 surface.

Furthermore, while movable member 2 and substrate 3 are formed of graphite, a highly heat conductive and refractory material, they may be formed of any material that is resistant to the melt. Any material that hardly reacts with the melt, such as silicon carbide, quartz, silicon nitride, boron nitride, alumina and zirconium oxide, may be selected, as appropriate, to consider the melt to be used. In particular, a melt of silicon has a high temperature and is also highly reactive and it is thus extremely difficult to select a material for the members, as appropriate. Graphite is an extremely superior material for any member in terms of heat conductivity, expansion rate, cost and many other aspects. In other words, in selecting a material for the substrate, such factors are considered as: whether the material is industrially not costly; the quality, properties and the like of a sheet to be grown; and the like. Elements applied to grow a sheet and various materials for the substrate can be variously combined. Furthermore, while movable member 2 as provided in the present embodiment is internally cooled with an inert gas, it may alternatively have a surface of metal cooled with water and coated with graphite, quartz or the like.

The crystal sheet production apparatus is used to produce a sheet of silicon in a method, as will now be described by way of example.

Initially, main chamber 1 is internally substituted with argon. Through port 6 crucible 9 receives silicon and it is thus filled therewith and in approximately three hours crucible 9 is heated to a temperature higher than the melting point of silicon by 70° C., i.e. 1500° C. The source material of silicon is completely melted and the silicon has a liquid level maintained at a level 10 mm lower than an upper end of crucible 9. In this condition the set temperature is lowered to maintain melt 8 to have a temperature 30° C. higher than its melting point. Furthermore, movable member 2 is cooled by gaseous nitrogen introduced via nozzle 110. Alternatively, movable member 2 may be cooled with different gas, such as gaseous helium, gaseous argon, or the like. Furthermore, depending on its structure movable member 2 can also be cooled with water.

After the temperature is stabilized, movable member 2 with the cooling gas is rotated at 1 rpm and platform 5 is elevated to provide a distance of 10 mm between the liquid level of the silicon and substrate 3. Furthermore the temperature is allowed to attain equilibrium. Platform 5 is further elevated to immerse substrate 3 of 5 mm thick in melt 8 of silicon approximately 3 mm deep, as measured from the substrate 3 surface, to solidify and thus grow a sheet of silicon. When movable member 2 almost achieves one revolution platform 5 is lowered to stop the immersion and heater 4 is powered off. Main chamber 1 stands to cool and when its temperature is lowered to approximately the same level as the room temperature an obtained sheet of silicon is collected. Since substrate 3 is cooled by movable member 2, substrate 3 is hardly permeated by the melt of silicon not reacts therewith. As such, simply with a light touch by hand the sheet of silicon can be removed from substrate 3 and thus collected.

The obtained sheet of silicon has a size corresponding to the dimensions of the substrate, having longitudinal and lateral dimensions of 70 mm and 25 mm, respectively, and a thickness of 0.4 mm. Except one sheet obtained from the last immersion and thus having a droplet of the melt, eleven sheets can be obtained and thus used as solar cell substrates The obtained sheet of silicon is used to fabricate a solar cell through a process for fabricating a polycrystalline solar cell including the step of forming an anti-reflection coating of SiN through plasma CVD (Chemical Vapor Deposition). The obtained solar cell has a cell size of a longitudinal dimension of 2 cm and a lateral dimension of 2 cm and has a conversion efficiency of 13%.

In the present embodiment, after movable member 2 has rotated once its rotation is stopped and an obtained sheet is then removed and collected. Alternatively, a vacuum chamber ox the like can be used to remove and collect a sheet while movable member 2 rotates.

Second Embodiment

Figure 4:
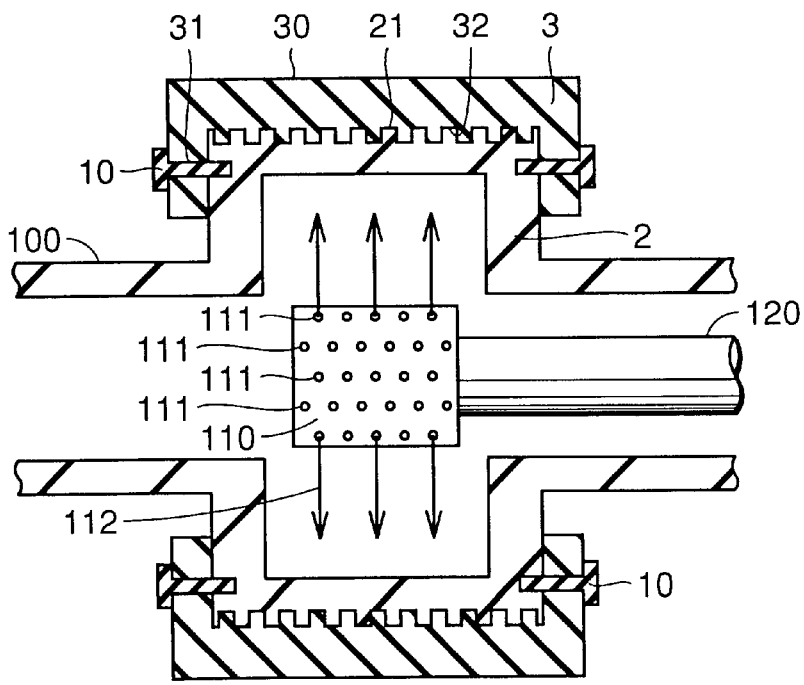
FIG. 4 is a cross section of a movable member in a second embodiment of the present invention.

The second embodiment is distinguished from the first embodiment in that as shown in FIG. 4, movable member 2 and substrate 3 contact each other on their respective, unleveled surfaces 21 and 32 fit into each other. In other words, movable member 2 and substrate 3 are unleveled 21 and 32, respectively, and thus fit into each other.

Such an apparatus as shown in FIG. 4 is used to produce a sheet of crystallized silicon through a process similar to that as described in the fist embodiment. Since movable member 2 and substrate 3 contact each other on their respective unleveled surfaces 21 and 32, movable member 2 and substrate 3 can be improved in thermal conductivity and substrate 3 can be cooled more efficiently. As such, even with a cooling gas having 80 to 90% of a flow rate of a cooling gas used in the first embodiment the present embodiment still can be as effective as the first embodiment.

Third Embodiment

Figure 5:
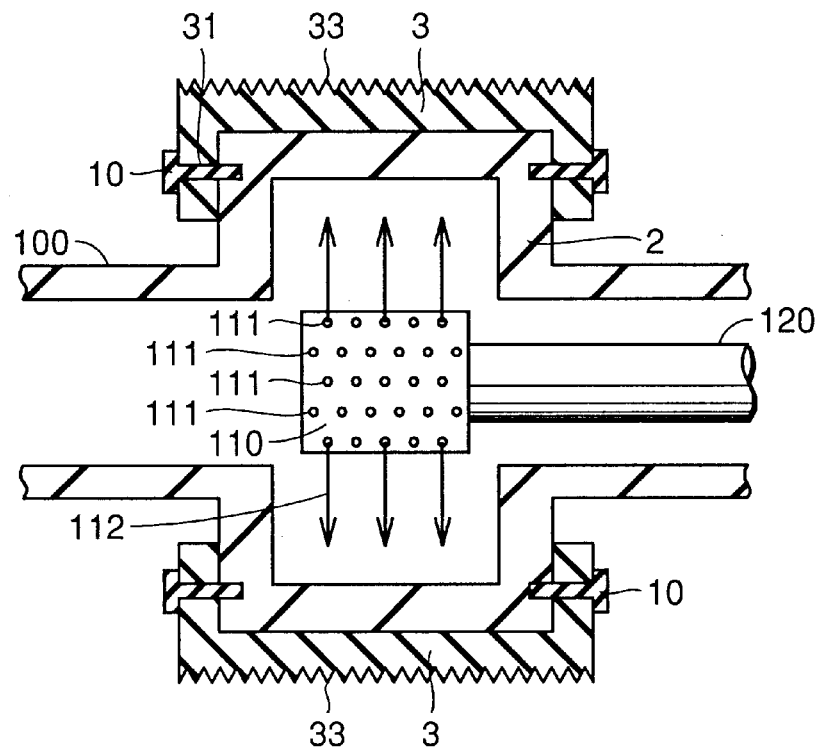
FIG. 5 is a cross section of a substrate in a third embodiment of the present invention.

The present embodiment is distinguished from the first embodiment in that, as shown in FIG. 5, substrate 3 has a crystal growing surface unleveled 33.

Such a substrate as shown in FIG. 5 is used in a process similar to that described in the first embodiment, to produce a sheet of crystallized silicon. If substrate 3 does not have a surface unleveled 33, there is observed along substrate 3 a dendrite of approximately several centimeters long. For substrate 3 having a surface unleveled 33, in contrast, on the substrate a protrusion has a tip serving as a point at which crystal growth starts. At a protrusion a sheet can be thick and at a recess in contrast the sheet can be thin to provide a sheet of silicon along a groove, periodically unleveled (corrugated). Although the present sheet of silicon is thinner than that produced in the first embodiment, having as thin a portion as no more than 200 μm in thickness, it can be periodically unleveled and thus have a level of mechanical strength preventing the sheet from cracking if the sheet is handled with tweezers or the like.

Figure 6:
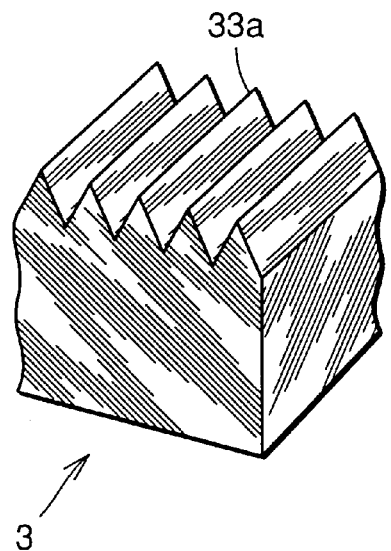
FIG. 6 is a perspective view of a substrate in another aspect of the third embodiment.
Figure 7:
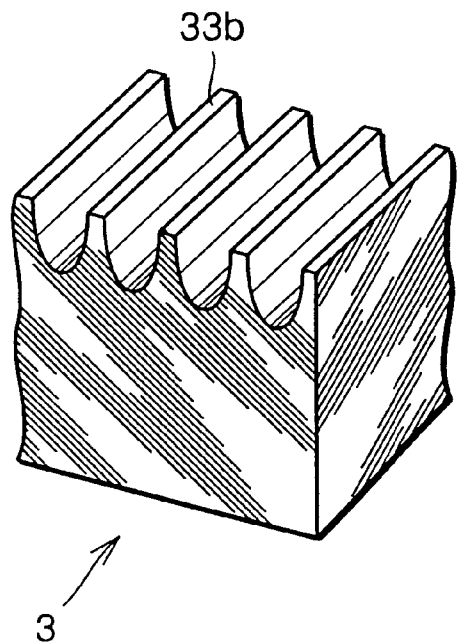
FIGS. 7 and 8 are each a perspective view of a substrate in still another aspect of the third embodiment.
Figure 8:
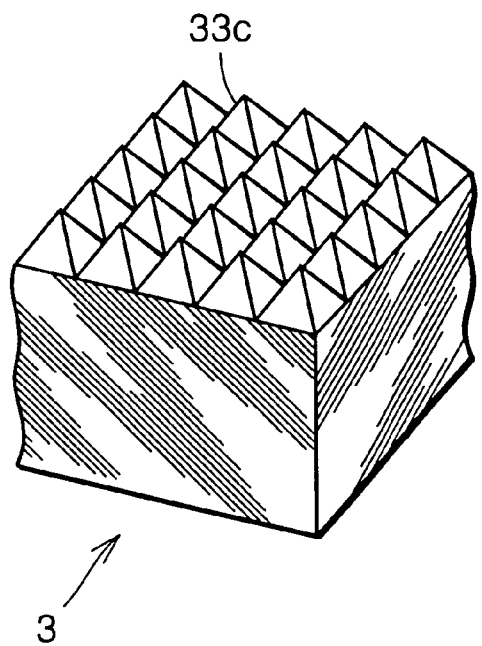

With reference to FIG. 6, an unleveled portion 33a may be formed of a linear, V-letter groove of one millimeter in pitch and one millimeter in depth. Furthermore, as shown in FIG. 7, an unleveled portion 33b having a linear, U-letter groove is similarly effective. White these linear grooves are provided parallel to the direction in which movable member 2 rotates, those provided perpendicular to the movable member 2 rotation are similarly effective. Furthermore an unleveled portion 33c in the form of mountains may be provided, as shown in FIG. 8. If a V-letter, pointed recess is provided, as shown in FIG. 8, crystal growth starts at points corresponding to protrusions uniformly distributed. As such, a columnar crystal having a uniform grain size can be grown to to further reduce dendrite disturbing the growth of a sheet of silicon.

Fourth Embodiment

Figure 9:
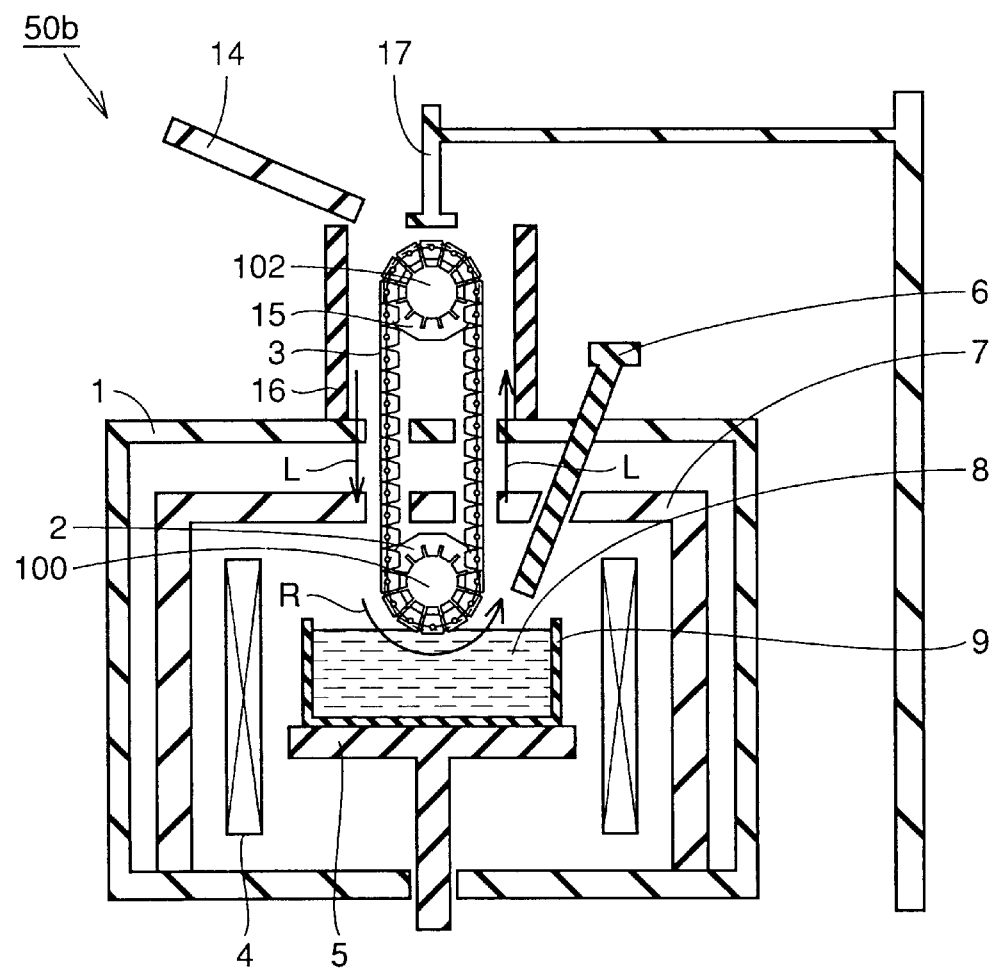
FIG. 9 is a schematic cross section of a crystal sheet production apparatus in a fourth embodiment of the present invention.

An apparatus of the present embodiment is distinguished from that of the first embodiment mainly in that, as shown in FIG. 9, the present embodiment provides an apparatus 50b with substrates 3 connected in the form of a caterpillar and thus guided to movable member 2 to allow a sheet of silicon to be continuously grown and collected In the present embodiment, crystal sheet production apparatus 50b includes main chamber 1, insulator 7 provided internal to the main chamber, movable member 2, substrate 3, heater 4 provided inner than insulator 7, port 6 for introducing a source material, melt 8, crucible 9 holding melt 8 therein, platform 5 supporting the crucible, a top door 14, a roller 15, and an output chamber 16. In the present embodiment, as in the first embodiment, with substrate 3 formed of graphite and melt 8 of silicon the apparatus is used to produce a sheet of silicon, as will now be described.

More specifically, apparatus 50b for use in producing a sheet of silicon is provided with substrate 3 in the form of a plate having a main surface on which a sheet of crystal is formed, crucible 9 serving as a container holding melt 8 therein, movable member 2 holding substrate 3 to bring a main surface 30 of the substrate into contact with melt 8 and then move substrate 3 away from melt 8, and a cooling means (not shown in FIG. 9) for cooling movable member 2. Note that the cooling means is similar to nozzle 110 shown in FIG. 4 and it is provided internal to shaft 100. Apparatus 50b is further provided with roller 15 serving as a means for removing from the substate's main surface 30 a crystal sheet formed thereon. Roller 15 is fixed to a shaft 102.

Substrates 3 connected in the form of a caterpillar are engaged on movable member 2 and roller 15 provided in output chamber 16. Movable member 2 and roller 15 can be synchronously rotated to move substrate 3 successively between melt 8 and output chamber 16. Output chamber 16 with top door 14 closed can be hermetically sealed. After main chamber 1 has its internal atmosphere substituted with gaseous argon, top door 14 can be opened and a vacuum chuck 7 can be used to collect a sheet of silicon. Note that main chamber 1 has a slit sealed with gaseous argon. As such, if output chamber 16 is provided in an opened system, output chamber 16 can have an internal ambient of an inert gas maintained regardless of the ambient external thereto. Movable member 2 rotates in direction R and substrate 3 thus moves in a direction L.

Figure 10:
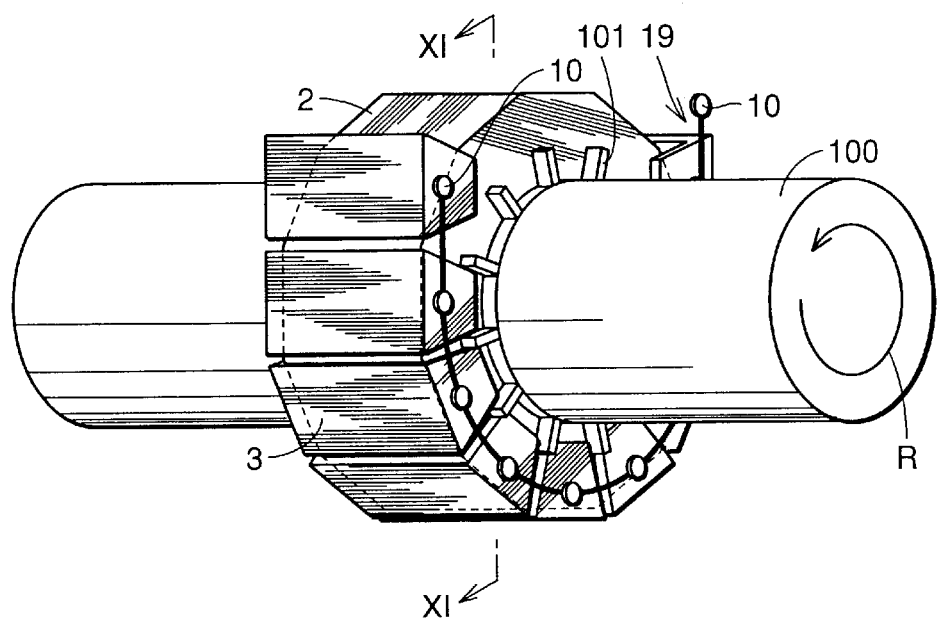
FIG. 10 is an enlarged perspective view of the FIG. 9 movable member.

With reference to FIG. 10, shaft 100 is provided with movable member 2 in the form of a polygonal prism. Movable member 2 is provided with a stud 101 fit between adjacent substrates 3. Stud 101 rotates together with movable member 2 in direction R and substrate 3, engaging stud 101, thus also rotates in direction R.

Figure 11:
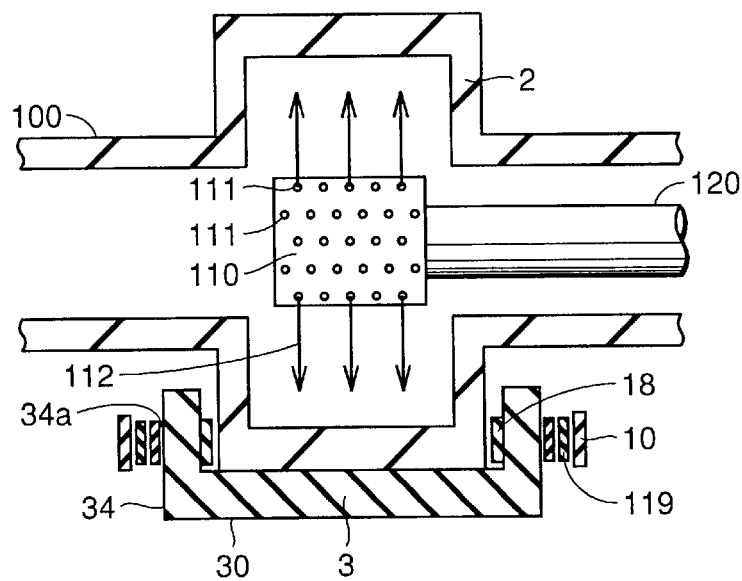
FIG. 11 is a cross section as seen along the XI—XI line of FIG. 10.

With reference to FIG. 11, movable member 2 is internally provided with nozzle 11 serving as a cooling means. Nozzle 110 has hole 111 through which a cooling gas is sprayed in a direction 112. Nozzle 110 is connected to a pipe 120. Substrate 3 is provided in contact with movable member 2. Substrate 3 has main surface 30 for growing a crystal sheet. Substrate 3 has a raised portion 34, which is provided with bolt 10, a nut 18 and a plate 119.

Figure 12:
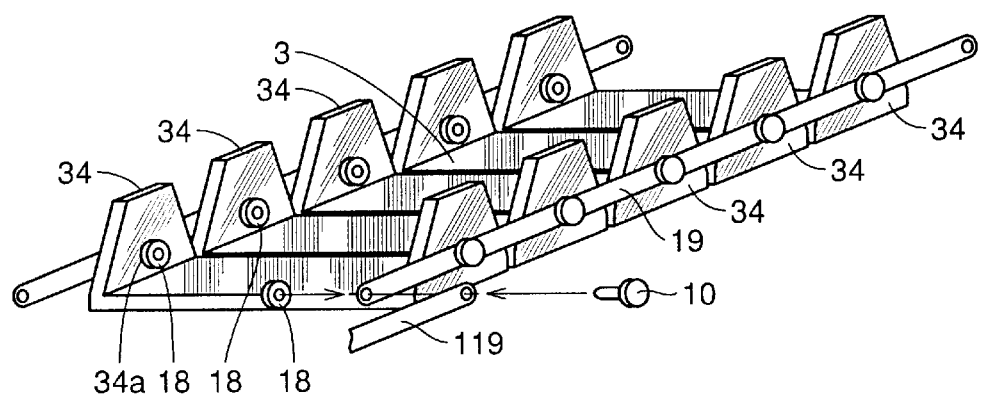
FIG. 12 is a perspective view of substrates connected together in the form of a caterpillar.

With reference to FIG. 12, substrates 3 are mutually connected by highly refractory and rubricative graphite nut 18, plate 119 and bolt 10. Bolt 10 is inserted into a hole of substrate 3 and that of plate 119. Substrate 3 is pivotable relative to plate 119. Furthermore, raised portion 34 is provided with a hole 34a serving as a connection. Bolt 10 is inserted into a hole of substrate 3 and that of plate 119 to allow substrate 3 to be rotatable relative to plate 119. A plurality of plates 119 are connected together by bolt 10 and nut 18 to form a guiding member 19.

Substrates 3 connected together can be engaged around movable member 2 in the form of a caterpillar, as shown in FIG. 10. Bolt 10, nut 18 and plate 119 are positioned to be higher in level than the liquid level of the melt with movable member 2 immersed in the melt, to prevent a movable portion after crystal growth from being locked. The substrates may alternatively be connected together with a highly refractory wire, such as carbon wire. More specifically, apparatus 50b for use in producing a crystal sheet further includes guiding member 19 in the form of a belt guiding substrate 3 to movable member 2 and roller 15. Guiding member 19 is configured of bolt 10, nut 18 and plate 119. Guiding member 19 connects a plurality of substrates 3 together in the form of a caterpillar. Substrate 3 has opposite ends each provided with raised portion 34 having hole 34a serving as a connection for connecting adjacent substrates to guiding member 19.

A process similar to that described in the first embodiment is employed to melt silicon and movable member 2 and roller 15 are then synchronously rotated to immerse substrate 3 successively into melt 8 to provide crystal growth. Substrate 3 is moved past a slit sealed with gas and it is thus transported to output chamber 16, where vacuum chuck 17 is used to remove a sheet of silicon successively from substrate 3 to collect the sheet. Through this process there can be successively produced per minute 12 sheets of silicon similar to that provided in the first embodiment.

While in the present embodiment movable member 2 has a rotative mechanism, the movable member does not need to rotate and may be fixed as long as connected substrates are successively guided to a cooling element. Furthermore, while movable member 2 is provided in the form of a prism having 12 angles as seen in a cross section and substrate 3 has a flat geometry, they may have any other geometry that allows them to be provided in contact with each other. Furthermore, while as a means for guiding substrate 3 to movable member 2 substrates 3 are connected together in the form of a caterpillar, substrates 3 connected together may be moved and thus wound up as they are brought into contact with cooled movable member 2.

Furthermore, using in the present embodiment substrate 3 and movable member 2 in contact with each other on their respective, unleveled surfaces, allows the substrate to be cooled more effectively than in the second embodiment. Furthermore, a protrusion and a recess engaging each other can effectively prevent substrate 3 and movable member 2 from sliding relative to each other. Furthermore, substrate 3 having a surface unleveled 13 is as effective as in the third embodiment.

In the present invention, a movable member having an outer peripheral surface with a substrate thereon is rotated and while the substrate is immersed in a melt a crystal is grown. When it is drawn up from the melt the crystal can be removed from the substrate to successively produce a crystal sheet flat and free of warpage.

If a substrate is formed of refractory graphite and a melt of silicon is used, a sheet of silicon is produced, as follows: the melt of silicon permeates into pores of graphite corresponding to a sintered compact or the substrate surface experiences a chemical reaction and a firm SiC layer results. A substrate silicon layer is firmly bound by immersing Si, SiC and the like and the substrate thus has a grown layer, i.e., a Si layer, adhering thereto.

In contrast, if the substrate is cooled approximately 200° C. lower than the melting point of silicon, before the melt of silicon permeates into graphite it solidifies and the substrate thus has a surface covered with a solid layer of silicon. Thereafter, the silicon grows to increase its thickness. Then, when the substrate is drawn up from the melt the silicon layer is rapidly cooled. When silicon is cooled to approximately 500° C. the difference between the coefficient of thermal expansion of silicon and that of thermal expansion of graphite can almost eliminate the necessity of applying mechanical strength in removing the silicon layer from the substrate to readily provide a plate of silicon.

Furthermore in the present invention a guiding member can feed substrates successively to a movable member to improve productivity. Furthermore in the present invention substrates are connected together in the form of a caterpillar. In the present invention the guiding member can successively send substrates connected for example in the form of a caterpillar to efficiently produce a crystal sheet.

Furthermore in the present invention a substrate has opposite ends each provided with a raised portion provided with a connection for connecting the substrate. The present invention can prevent the connection from being immersed into a melt and thus damaged.

Furthermore in the present invention a movable member is provided in the form of a polygonal prism. In the present invention, a flat substrate can be combined with a cooling element provided in the form of a polygonal prism. As such, the substrate contact the movable member via a plane and the substrate can thus contact the movable member serving as the cooling element over a wide area. Consequently, the substrate can be cooled more efficiently.

Furthermore in the present invention a movable member and a substrate are unleveled and thus fit into each other. In the present invention, the substrate and the movable member as a cooling element can contact each other on their respective, unleveled surfaces. As such, they can contact each other over an area larger than when they contact each other via a flat plane. Thus the substrate can be cooled further more efficiently. Furthermore, if substrates are successively guided to the movable member, the present invention can effectively prevent the substrates from coming off the movable member in operation.

Furthermore in the present invention a substrate has a crystal growing surface unleveled with a pointed or linear protrusion. In the present invention, the substrate having a crystal drawing surface unleveled allows a protrusion to have a tip with a crystal nucleus created thereon. This can facilitate controlling a crystal in grain size and a sheet of silicon in thickness to obtain a sheet having a thickness and geometry as described Furthermore in the present invention a movable member having an outer peripheral surface with a substrate thereon and serving as a cooling element is rotated and while the substrate is immersed in a melt a crystal grows. When it is drawn up from the melt the crystal can be removed from the substrate to successively produce crystal sheets flat and free of warpage. Furthermore, guiding substrates successively to the movable member can feed substrates successively to the movable member to improve productivity.

Furthermore in the present invention a guiding member can be used to successively transport a large number of substrates to a movable member and immerse the substrates into a melt to allow crystal growth and after the substrates are moved away from the movable member a crystal sheet can be removed outside a heating chamber and the sheet can thus be readily removed. Furthermore the present invention can also prevent a mechanism used for removing a crystal sheet from being exposed to high temperature.

Fifth Embodiment

Figure 13:
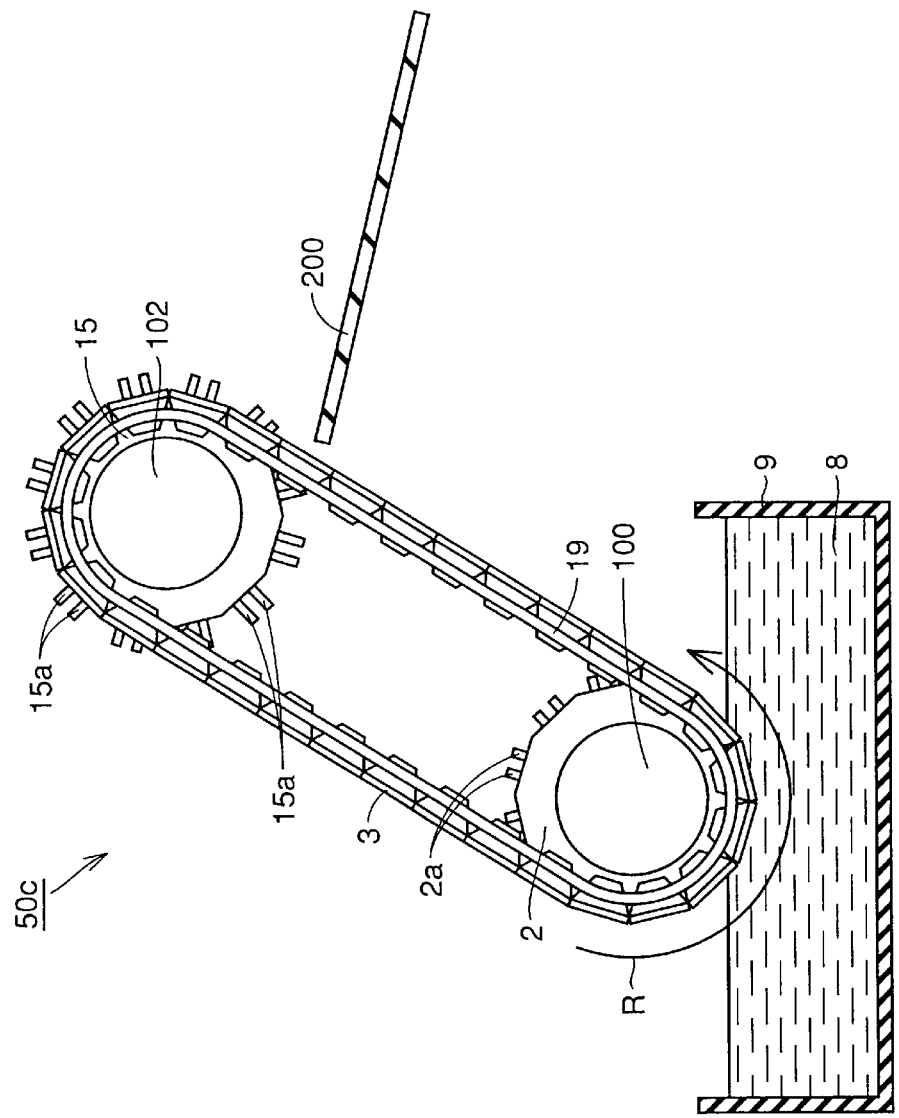
FIG. 13 is a schematic cross section of a crystal sheet production apparatus in a fifth embodiment of the present invention.

With reference to FIG. 13, a fifth embodiment of the present invention provides an apparatus 50c for use in producing a crystal sheet including substrates 3 in the form of a plate having a main surface on which a crystal sheet is to be formed, crucible 9 serving as a container holding melt 8 therein, movable member 2 holding substrate 3 to bring the substrate's main surface 30 into contact with melt 8 and then move substrate 3 away from melt 8, and a cooling means (not shown in FIG. 13) for cooling movable member 2. Furthermore, apparatus 50c also includes roller 15 serving as a means for removing a crystal sheet from the substrate 3 main surface.

Substrate 3 is provided with a throughhole and roller 15 has a first protrusion 15a fit into the throughhole. When the first protrusion 15a fits into the throughhole the first protrusion 15a protrudes from the throughhole.

As shown in FIG. 13, the present embodiment provides apparatus 50c for use in producing a crystal sheet including melt 8 and movable member 2 having a surface provided with a second protrusion 2a. Movable member 2 is surrounded by substrate 3 having a throughhole. When substrate 3 moves around movable member 2, it is partially or entirely immersed into melt 8 and it thus has a surface with a crystal sheet growing thereon. When substrate 3 is moved away from movable member 2 arrives at roller 15 its throughhole can receive the first protrusion 15a inserted therethrough and the crystal sheet can thus be readily and successively removed from the substrate.

Movable member 2, the second protrusion 2a and substrate 3 are required to be formed of a material having a sufficient level of durability at high temperature. For example, highly pure graphite, aluminum oxide, zirconium oxide, silicon carbide, silicon nitride or boron nitride are considered, although graphite is desirable in terms of cost and workability. Furthermore, hollow, movable member 2 is internally provided with a cooling means passing a coolant such as gas to cool movable member 2. As such, movable member 2 and the like can also be formed of a material having a lower melting point, Apparatus 50c is provided internal to a sealable chamber (not shown) and after the chamber is exhausted and thus vacuumed the chamber is filled with an inert gas for gas substitution. The inert gas must not react with melt 8, and argon, helium or the like can be used, although argon is more desirable in terms of cost. In the chamber a plurality of heaters are desirably provided to precisely control temperature profile. Thus, melt 8 in crucible 9 can have a temperature profile controlled with high precision to produce a crystal sheet with high reproducibility. When movable member 2 is brought into contact with melt 8, melt 8 is rapidly cooled and if the melt 8 temperature is around its freezing point melt 8 can solidify when movable member 2 is immersed therein. As such, the melt 8 temperature is desirably several tens degrees higher than its melting point.

Crucible 9, as well as movable member 2 and the like, is required to have a level of durability at high temperature. As such, typically, crucible 9 is preferably formed of a material similar to that forming movable member 2. Furthermore, crucible 9 is desirably provided with an elevating mechanism (not shown), since to grow a crystal sheet on a surface of movable member 2, movable member 2 is required to be constantly immersed in melt 8 by a single level of depth. Such an elevating mechanism as described above allows crucible 10 to ascend and descend to constantly maintain a depth of movable member 2 immersed in melt 8. This can also be achieved by successively adding a melted source material, a powdery source material or the like to melt 8. The apparatus thus configured can form crystal sheets successively.

Apparatus 50c for use in producing a crystal sheet is formed of components, as will now be described in detail.

Figure 14:
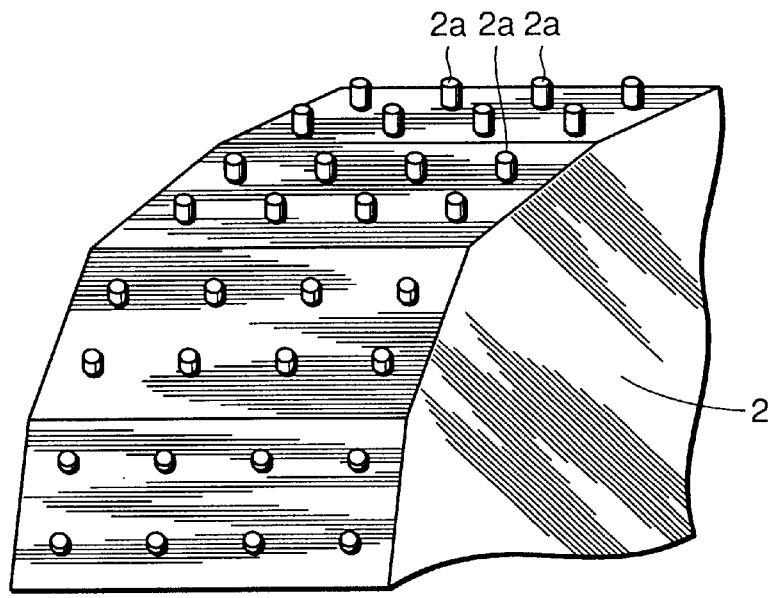
FIG. 14 is an enlarged perspective view of the FIG. 13 movable member.
Figure 15:
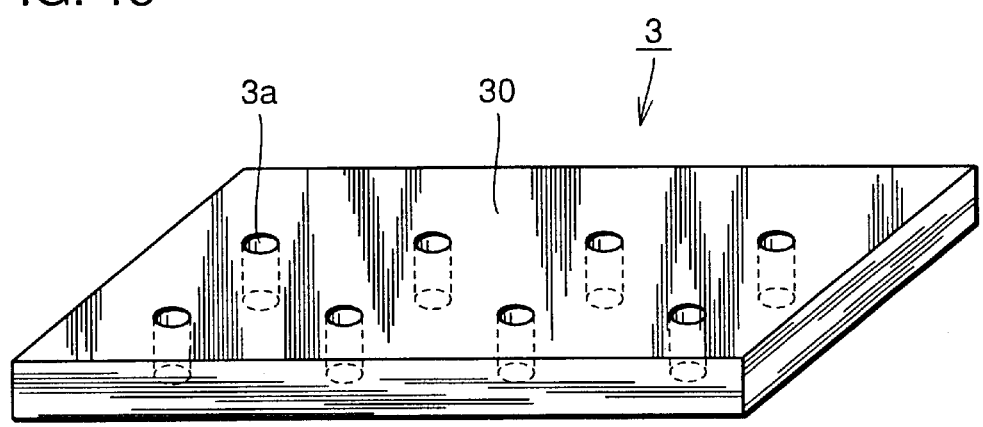
FIG. 15 is a perspective view of a substrate corresponding to the FIG. 14 movable member.

With reference to FIG. 15, a substrate is provided with a raised portion similar to that described in the fourth embodiment, although this raised portion is not shown in FIG. 15. With reference to FIGS. 14 and 15, movable member 2 has a surface provided with a plurality of the first protrusions 2a in a direction m which movable member 2 rotates. Substrate 3 has main surface 30 on which a crystal sheet is to be grown. Substrate 3 is provided with throughhole 3a provided at a position corresponding to the first protrusion 2a. When substrate 3 is arranged around movable member 2, its throughholes 3a all receive the first protrusions 2a. In the present invention substrate 3 is structured to have throughhole 3a receiving the first protrusion 2a of movable member 2 serving as a cooling element. As such, while substrate 3 has a throughhole the first protrusion 2a of movable member 2 matching throughhole 3a can prevent at least a portion of a melted material including a metal material, a semiconductor material and the like from permeating into movable member 2. It is not a requirement that the first protrusion 2a and throughhole 3a be shaped in such a cylinder as shown in FIGS. 14 and 15.

Figure 16:
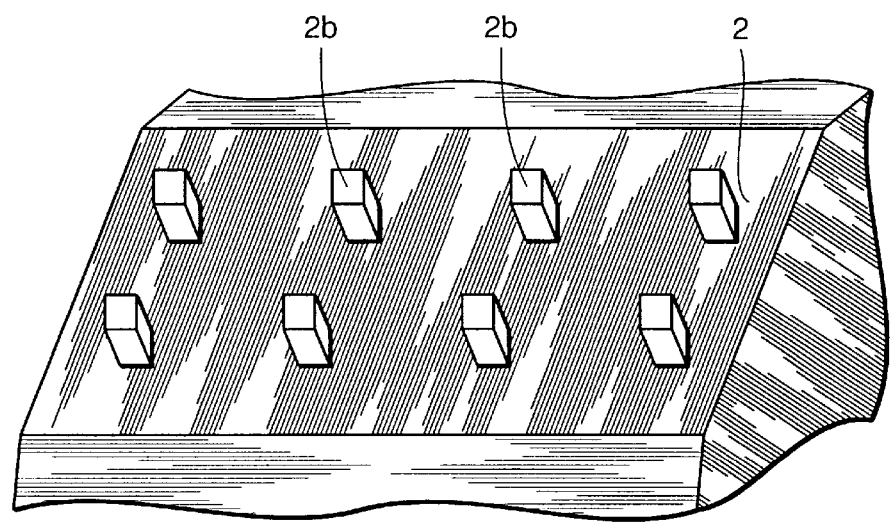
FIG. 16 is a perspective view of a movable member in another aspect of the present invention.
Figure 17:
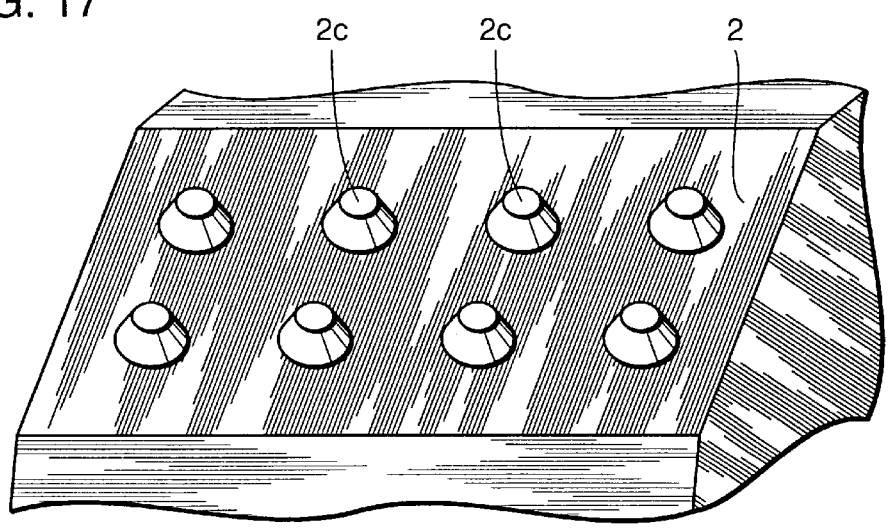
FIGS. 17–19 are each a perspective view of a movable member in still another aspect of the present invention.
Figure 18:
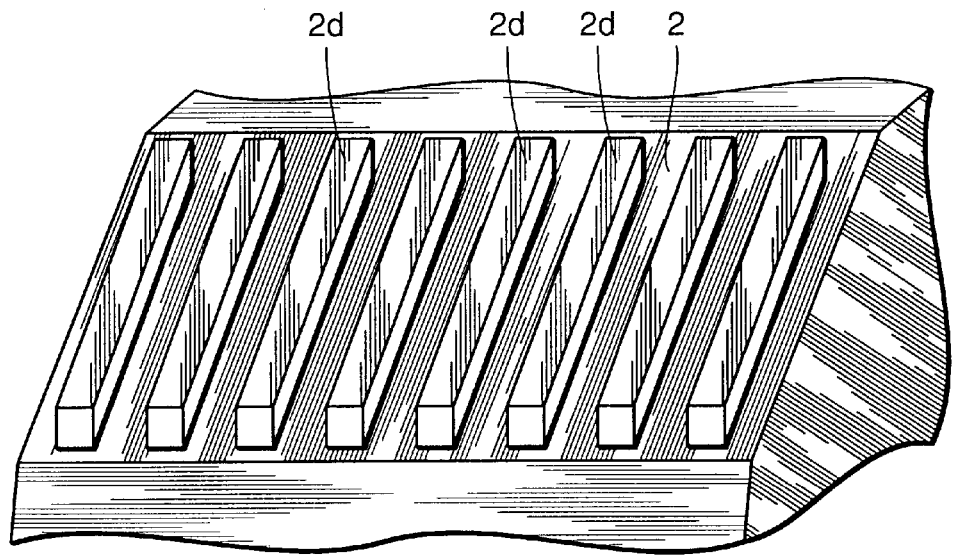
Figure 19:
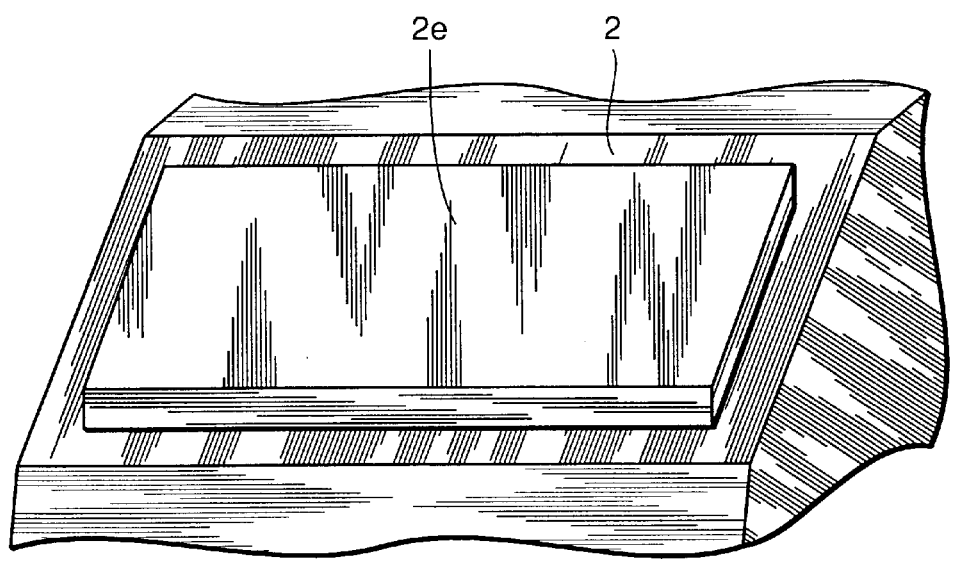

With reference to FIG. 16, a first protrusion 2b may be provided in the form of a prism. With reference to FIG. 17, a first protrusion 2c may be provided in the form of a truncated cone, shaped to have upper and lower sides different in area. With reference to FIG. 18, a second protrusion 2d may be provided in the form of a prism extending in one direction. Furthermore, with reference to FIG. 19, a second protrusion 2e may occupy a significantly large area. As such, the second protrusion can vary in geometry. If these second protrusions are used, corresponding to their respective geometries a substrate can have a throughhole accordingly similarly shaped. More specifically, the substrate can have a throughhole shaped in the form of a truncated cone, that in the form of a prism and that occupying a significantly large area, although the substrate's strength at high temperature, the removability of a crystal sheet grown on the substrate and the like should be considered in designing the throughhole.

Furthermore, the substrate 3 temperature can be readily controlled by the geometry, diameter, number and the like of throughholes of the substrate. A portion of substrate 3 provided with throughhole 3a contacts movable member 2 over a larger or smaller area than a portion thereof not provided with throughhole 3a. As such, the ability of movable member 2 to cool substrate 3 can be controlled for different sites. In particular, substrate 3 can be significantly effectively cooled at a portion of movable member 2 with a protrusion in direct contact with melt 8. As such, arranging throughhole 3a as appropriate allows substrate 3 to have a crystal growing surface having not only a uniform temperature but also a temperature profile as desired.

Figure 20:
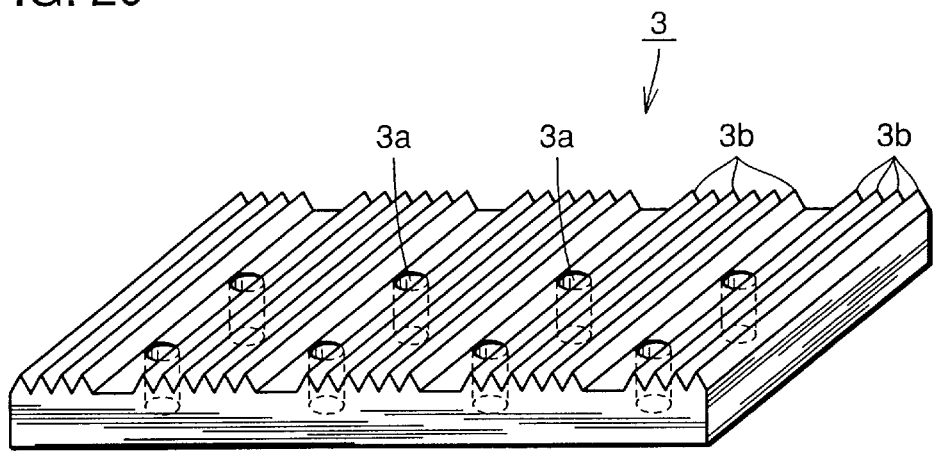
FIG. 20 is a perspective view of a substrate in another aspect of the present invention.
Figure 21:
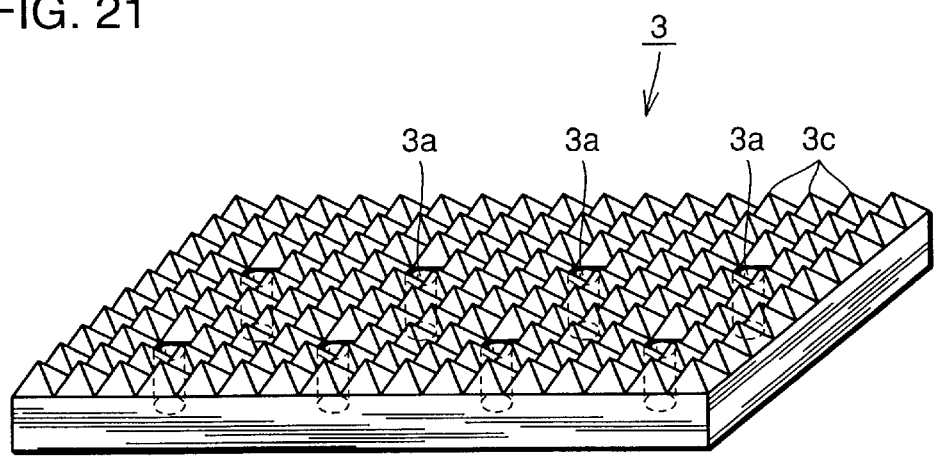
FIGS. 21–23 are each a perspective view of a substrate in still another aspect of the present invention.

The substrate described hereinafter is provided with a raised portion similar to that described in the fourth embodiment, although this raised portion is not shown. While the substrate shown in FIG. 15 has a flat surface, it can have a surface provided with fine protrusion and recess, as shown in FIGS. 20–23. Substrate 3 shown in FIG. 20 is provided with a linear protrusion 3b. Substrate 3 shown in FIG. 21 is provided with a pointed protrusion 3c. These linear and pointed protrusions can be obtained by recessing a surface of a substrate having throughhole 3a. A linear protrusion and a pointed protrusion each refers to a protrusion existing in a surface of the substrate of interest.

Unleveling a surface of a substrate makes it possible to readily control a point on a crystal growing surface at which a crystal nucleus is created. If a substrate has a flat surface it is difficult to control a point at which a crystal nucleus is created and other conditions for growing a crystal sheet, e.g., the temperature to be set, the rate at which the substrate is cooled, and the like, need to be controlled to control a point at which a crystal nucleus is created. In terms of reproducibility, providing a protrusion significantly facilitates controlling crystal growth, since if a crystal growing substrate has a flat surface a crystal nucleus is created at an irregular location. As such, dendrite growth tends to be dominant, resulting in a growing crystal sheet being increasingly unleveled. Providing a linear protrusion, a pointed protrusion or the like allows dendrite growth to be reduced to provide satisfactory smoothness. Furthermore, an obtained crystal sheet can contact substrate 3 along a line or at a point to improve removability.

Figure 22:
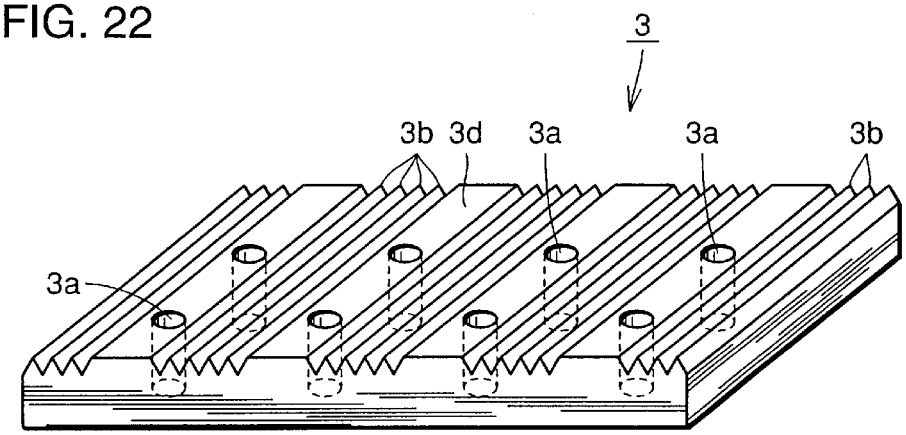
Figure 23:
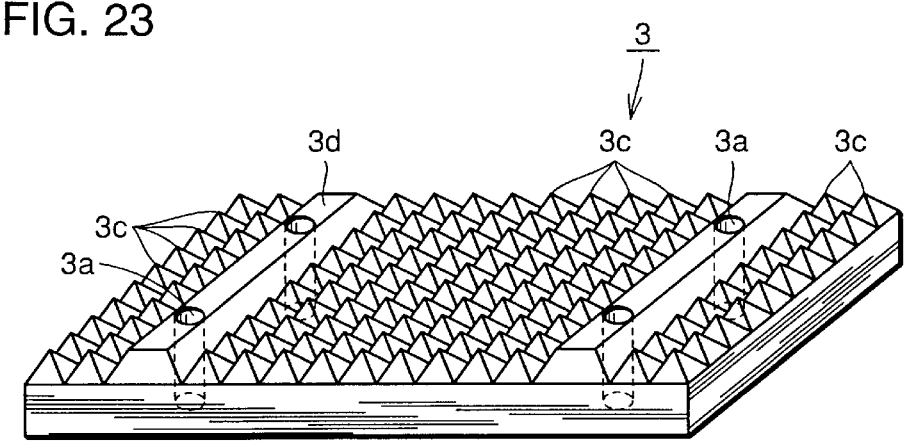

Furthermore, as shown in FIG. 22, substrate 3 may have a surface provided with linear protrusion 3b and a planar protrusion 3d. Furthermore, as shown in FIG. 23, substrate 3 may have a surface provided with pointed protrusion 3c and planar protrusion 3d. Planar protrusion 3d can enhance planarity. In contrast to a simply flat substrate, a substrate provided with linear and pointed protrusions 3b and 3c and also partially provided with planar protrusion 3d can also reduce dendrite growth. Substrate 3 partially provided with planar protrusion 3d allows a crystal sheet to be produced suitable for a device requiring an electrode to be formed as the electrode can be provided at the flat portion to form an elongate electrode without disconnection. Furthermore, planar protrusion 3d can also facilitate precisely controlling the removability of a sheet.

While in FIGS. 22 and 23 the substrate's throughhole 3a is provided in its planar protrusion 3d, the throughhole 3a position is not particularly limited. More specifically, throughhole 3a may be provided at any location in substrate 3 and its position is not limited to a flat portion of the substrate. Providing throughhole 3a at a flat portion allows a removing protrusion to be inserted into a flat portion of a sheet growing from substrate 3. This is preferable as the substrate is not damaged.

In any example, substrate 3 has an unleveled surface and a crystal nucleus is created preferentially at a protrusion of the unleveled surface corresponding to a portion brought into contact with melt 8. Since substrate 3 is cooled, a crystal starts to grow from the created crystal nucleus. Growing from the protrusion, the crystal curves and as it thus grows joins a crystal growing from a protrusion adjacent thereto, resulting in a crystal sheet having a curvature.

Figure 24:
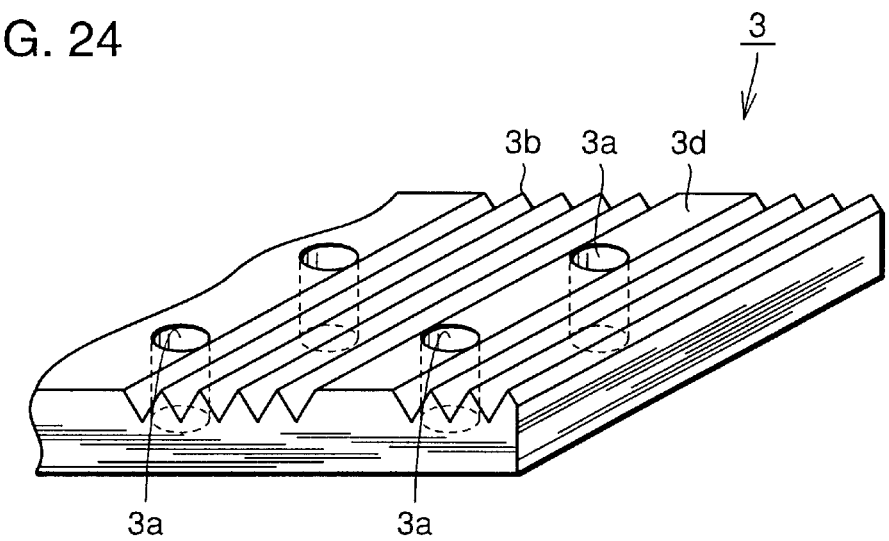
FIG. 24 is a perspective view of a portion of a substrate.
Figure 25:
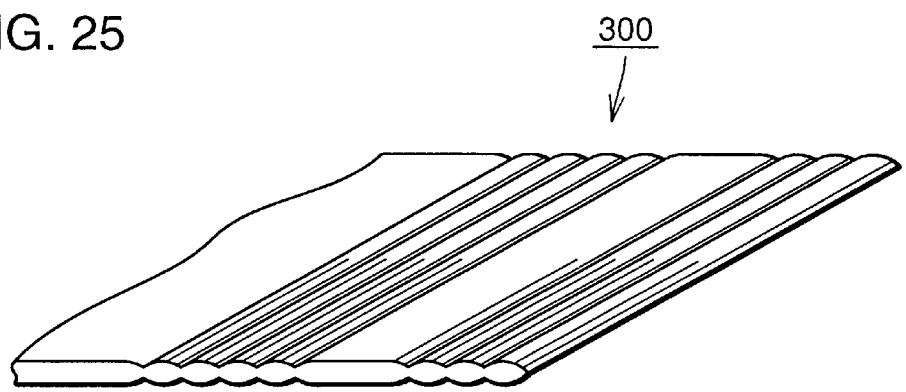
FIG. 25 is a perspective view of a crystal sheet obtained by using the FIG. 24 substrate.

With reference to FIGS. 24 and 25, a crystal nucleus is created on substrate 3 at linear protrusion 3b and planar protrusion 3d and therefrom crystal growth starts. As such, an obtained sheet at a portion at which crystal growth starts has a curvature. Thus, a sheet with a protrusion has a curvature. In contrast, a crystal sheet grown on the substrate at a flat portion is formed flat. As such, the flat portion of the crystal sheet is a location significantly suitable for forming an electrode for an electronic device requiring an electrode.

Figure 26:
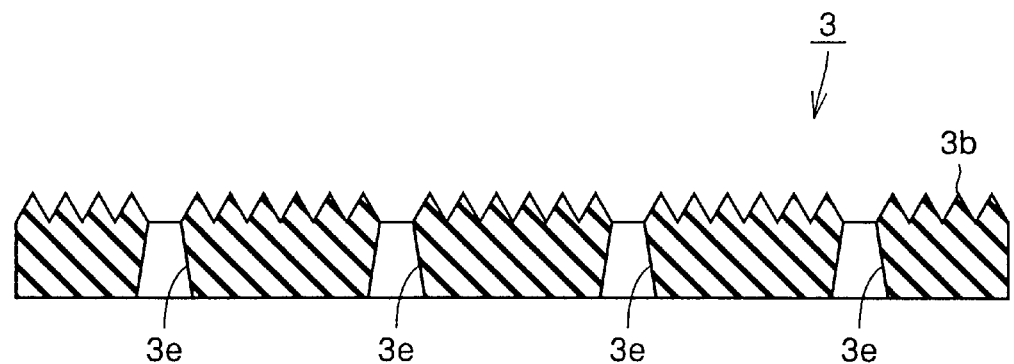
FIGS. 26 and 27 are each a cross section of a substrate in still another aspect of the present invention.
Figure 27:
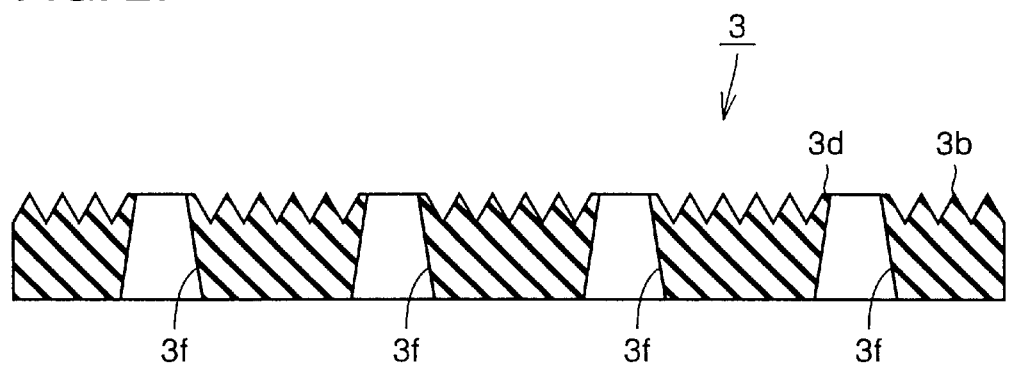

FIGS. 26 and 27 each show a cross section of an unleveled substrate having a throughhole therein FIGS. 26 and 27 are different in that throughholes 3e and 3f are different in depth. More specifically, in FIG. 26, throughhole 3e is lower in level than linear protrusion 3d and a pointed protrusion. In FIG. 27, throughhole 3f is higher in level than linear protrusion 3b (or a pointed protrusion). Throughholes 3e and 3f both taper. The FIG. 26 substrate may be provided with a linear protrusion. FIG. 27 shows substrate 3 provided with linear protrusion 3b and flat protrusion 3d. If the movable member has the second protrusion in the form of a truncated cone, throughholes 3e and 3f in the form of truncated cones as shown in FIGS. 26 and 27 can match the second protrusion to prevent a melted material from permeating therethrough Note that the substrate surface can be readily unleveled by providing a flat substrate with a recess. While as shown in FIGS. 26 and 27 this recess is provided m the form of the letter V, it may be a U-letter recess, a trapezoidal recess or the like. Furthermore, sheet growing rate, sheet removability and the like can be considered in adjusting the recess's pitch, depth and the like, since the surface tension of a melt of metal or semiconductor used, the temperature of substrate 3 and the mobility of substrate 3 affect the form of a growing sheet and the adhesion property and removability of the sheet with respect to the substrate 3 surface.

In particular, the recess desirably has a pitch, i.e., a distance from a vertex of a protrusion to that of a protrusion adjacent thereto, of at least 0.05 mm. If the recess has a pitch less than 0.05 mm., an obtained sheet has small crystal grains, which tend to deteriorate an electrical characteristic of an electronic device fabricated.

Figure 28:
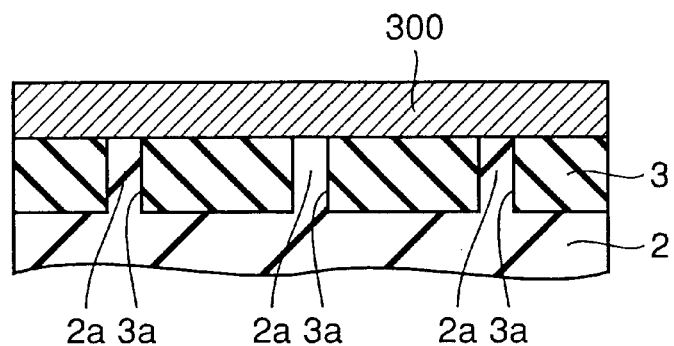
FIGS. 28–30 are each a cross section of a crystal sheet formed on a substrate surface.
Figure 29:
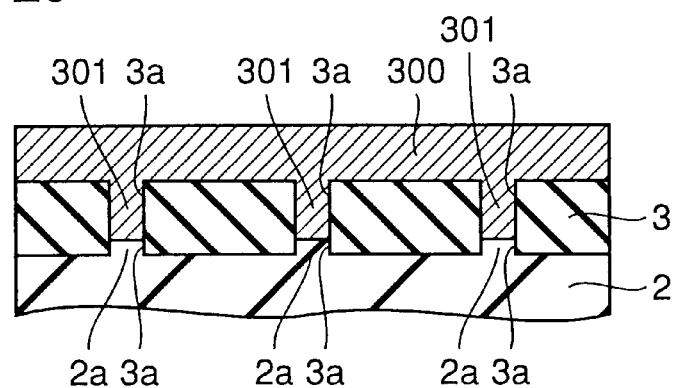
Figure 30:
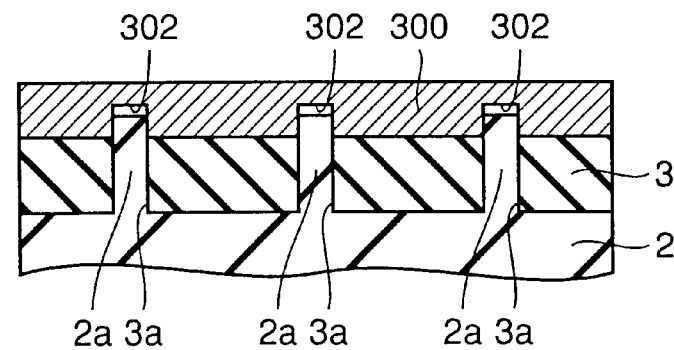

Reference will now be made to FIGS. 28–30 to describe a relationship between a thickness of the substrate and a height of the second protrusion of the movable member. In FIG. 28, the second protrusion of the movable member and throughhole 3a of the substrate match with a crystal sheet 300 formed on flat substrate 3.

As has been shown in FIG. 28, if the second protrusion 2a height is equal to the substrate 3 thickness, crystal sheet 300 obtained can have a flat crystal growth surface. However, it is not necessary for crystal sheet 300 to have a flat crystal growth surface. The second protrusion 2a height can be less than the substrate 3 thickness, as shown in FIG. 29, or the second protrusion 2a height may be greater than the substrate 3 thickness, as shown in FIG. 30, to allow crystal sheet 300 to have a crystal growth surface unleveled as desired. Thus crystal sheet 300 can be shaped as desired.

Figure 31:
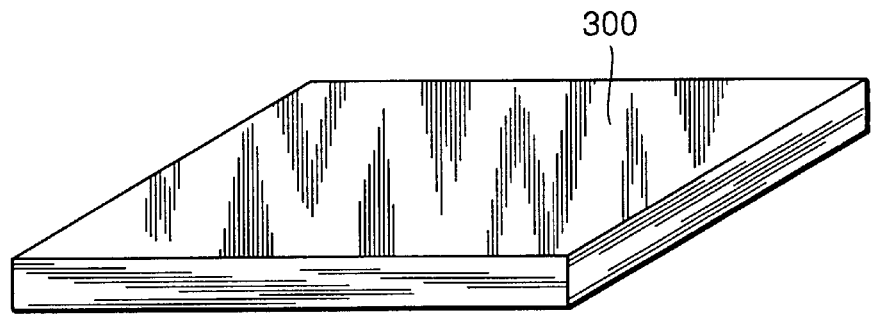
FIG. 31 is a perspective view of the FIG. 28 substrate.
Figure 32:
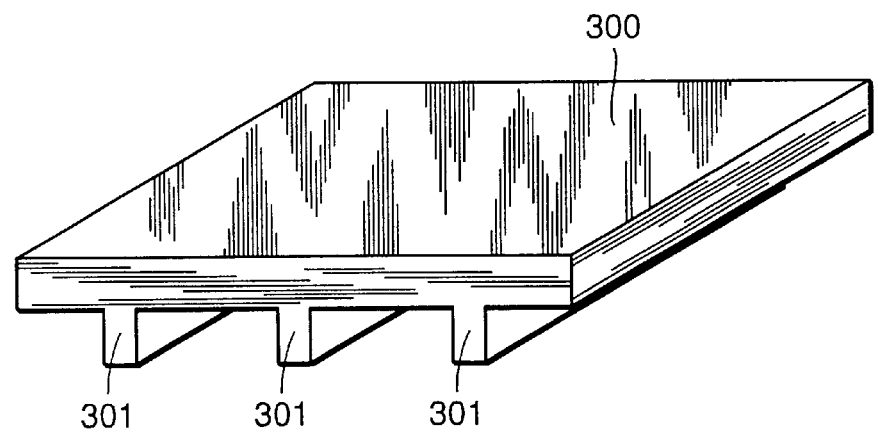
FIG. 32 is a perspective view of the FIG. 29 substrate.
Figure 33:
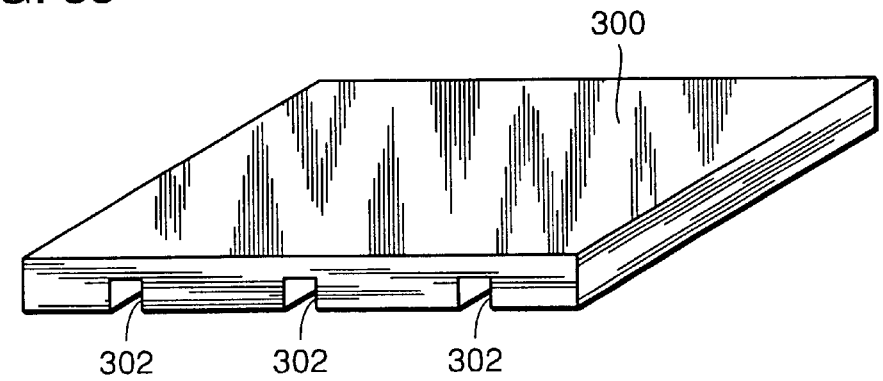
FIG. 33 is a perspective view of the FIG. 30 substrate.

FIGS. 31–33 are perspective views of crystal sheets produced by employing the substrate-movable member combinations as shown in FIGS. 28–30. As shown in FIG. 31, if the second protrusion 2a height is equal to the substrate 3 thickness, as shown in FIG. 28, then as shown in FIG. 31 a substantially flat crystal sheet 301 can be produced. If the second protrusion 2a length is less than the substrate 3 thickness, as shown in FIG. 29, then as shown in FIG. 32 crystal sheet 300 can have a surface provided with a protrusion 301. In contrast, if the second protrusion 2a length is greater than the substrate 3 thickness, as shown in FIG. 30, then as shown in FIG. 33 crystal sheet 300 can have a surface provided with a protrusion 302.

Thus, there can be obtained a crystal sheet more unleveled than a crystal sheet obtained by unleveling a surface of a substrate, as described above (see FIG. 25). Furthermore, movable member 2 can have the second protrusion 2a varying in height and substrate 3 can have a surface unleveled to obtain a sheet shaped as desired.

Figure 34:
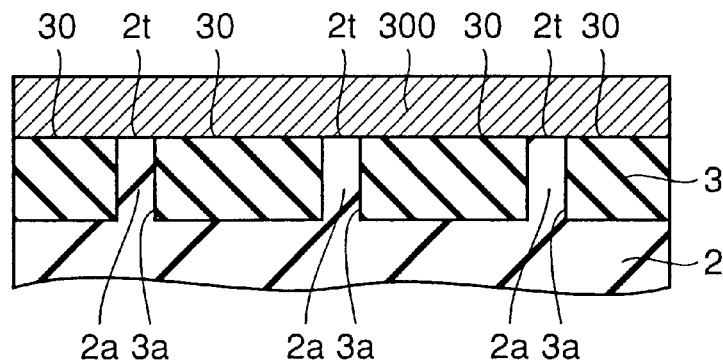
FIGS. 34 and 35 are cross sections showing a step of removing a crystal sheet from a substrate.

A sheet grown on a substrate is removed therefrom, as described with reference to FIGS. 34 and 35. As shown in FIG. 34, substrate 3 is initially immersed into a melt with movable member 2 having the second protrusion 2a fit into throughhole 3a of substrate 3. Thus substrate 3 has a surface with crystal sheet 300 growing thereon. Note that substrate 3 has main surface 30 that is not unleveled. Furthermore, the second protrusion 2a height is substantially equal to the substrate 3 thickness. More specifically, when the second protrusion 2a is fit into throughhole 3a the second protrusion 2a has a top surface 2t substantially level with main surface 30 of substrate 3. Movable member 2 draws substrate 3 up from the melt and crystal sheet 300 is thus grown. Thereafter, the second protrusion 2a is pulled out from throughhole 3a. Since substrate 3 and crystal sheet 300 are integrated and while the second protrusion 2a is pulled out from throughhole 3a crystal sheet 300 still can be transported.

Figure 35:
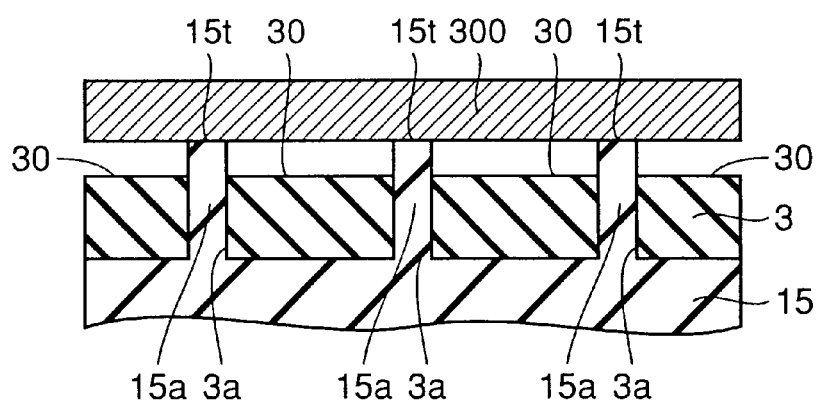

Then, with reference to FIG. 35, throughhole 3a receives the first protrusion 15a of roller 15. Thus crystal sheet 300 can be removed from substrate 3. More specifically, the first protrusion 15a having a height greater than the substrate 3 thickness can be inserted to directly push crystal sheet 300 to remove the sheet from substrate 3. When the first protrusion 15a is fit into throughhole 3a the first protrusion 15a has a top surface 15t protruding from throughhole 3a. Setting the first protrusion 15a height to be 105 to 120% of the substrate 3 thickness can seduce the first protrusion 15a height to a minimal value. The first protrusion 15a is significantly susceptible to high temperature and if it is greater in height its strength reduces for high temperature. As such, reducing the first protrusion 15a height to a minimal value can enhance the apparatus durability to increase the yield of crystal sheets produced by the apparatus of the present invention.

Furthermore, while mainly in a vicinity of the melt, heated to significantly high temperature, the apparatus is required to have its various mechanisms resistant to high temperature, the removal mechanism of the present invention can almost dispense with any mechanically movable portion and it can thus reliably continue to operate at high temperature. At least a single first protrusion 15a can suffice and in contrast with the second protrusion 2a of movable member 2 the first protrusion 15a does not need to be equal in number to the substrate's throughhole 8a, although the first protrusion 15a is required to have a position corresponding to that of any of throughhole 3a.

Figure 36:
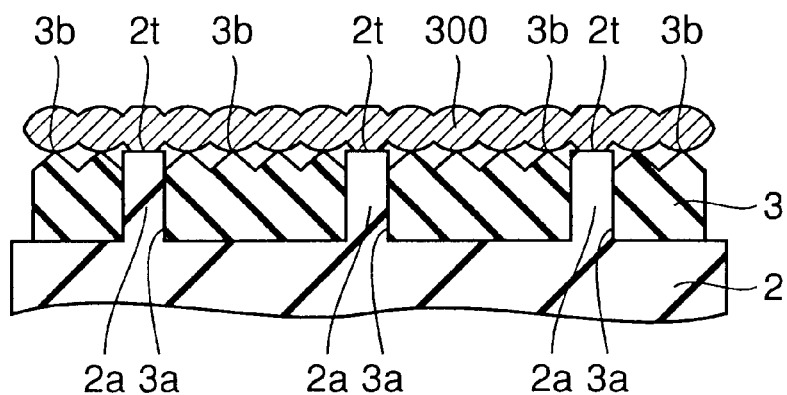
FIGS. 36 and 37 are cross sections showing a step in another aspect of removing a crystal sheet from a substrate.
Figure 37:
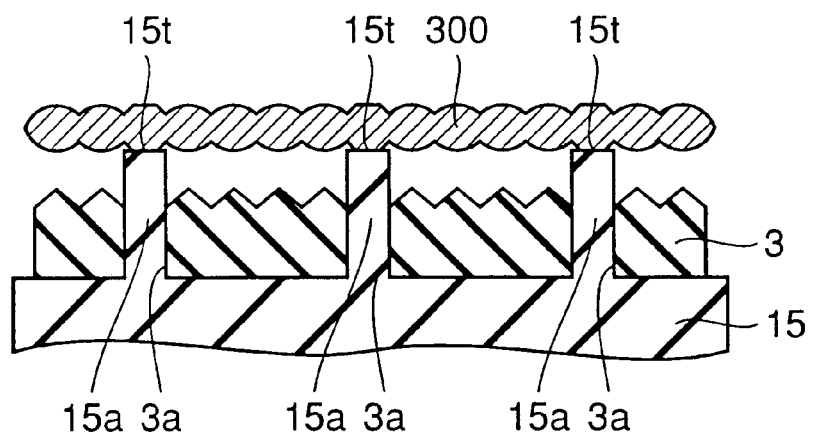

As shown in FIGS. 36 and 37, substrate 3 may have a surface provided with such a recess as linear protrusion 3d. In this example also, crystal sheet 300 is grown on a surface of substrate 3, as shown in FIG. 36. Then, the second protrusion 2a is pulled out from throughhole 3a and as shown in FIG. 37 the first protrusion 15a is inserted into throughhole 3a to remove crystal sheet 300 from substrate 3. Herein, crystal sheet 300 can be removed with a level of force smaller than when the sheet is removed from a flat main surface of substrate 3. This is attributed to the adhesion between crystal sheet 300 obtained and substrate 3. More specifically substrate 3 has a surface provided with linear protrusion 3b or a pointed protrusion and substrate 3 and crystal sheet 300 thus contact each other at a point or along a line. Consequently, the substrate and the sheet contact each other over an area smaller than when a flat substrate is used.

Thus providing the substrate 3 surface with throughhole 3a and unleveling its crystal growth surface can facilitate not only growing crystal sheet 300 on the substrate 3 surface but also removing the sheet from the surface.

As is apparent from the above, the adhesion between a surface of substrate 3 and crystal sheet 300 is an important factor in growing and removing crystal sheet 300.

Figure 38:
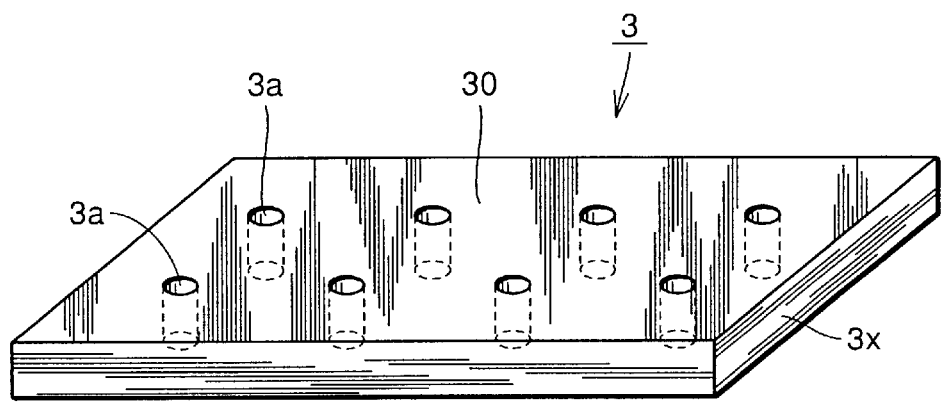
FIG. 38 is a perspective view of a substrate formed of a material.
Figure 39:
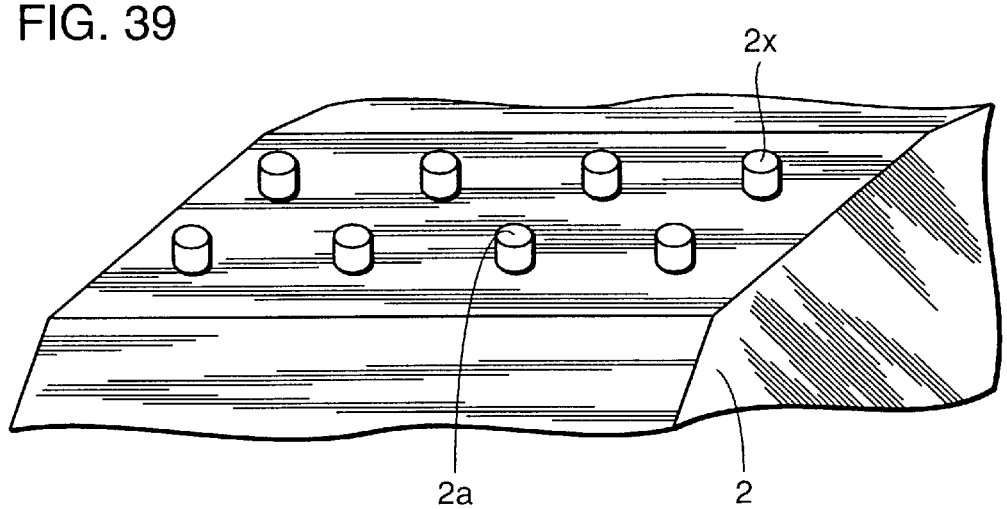
FIG. 39 is a perspective view of a movable member having a protrusion formed of a different material.

The contact therebetween is controlled in a manner, as will now be described. In FIG. 38, a plate of boron nitride 3x corresponds to substrate 3. Note that substrate 3 has a main surface 30 and throughhole 3a. With reference to FIG. 39, movable member 2 has the second protrusion 2a foamed of a column of silicon carbide 2x. More specifically, an end of the second protrusion 2a and a surface of substrate 3 art formed of different materials to allow a single crystal-sheet growth surface to be formed of materials providing more than one, different levels of removability and adhesion properties. Thus, adhesion property can be controlled. For example, in FIGS. 38 and 39, main surface 30 can be formed of a less adhesive material with respect to a crystal sheet while the second protrusion 2a can have an end formed of a more adhesive material with respect to the crystal sheet to provide an adhesion property intermediate between the two types of material. This can farther be controlled by the hole ratio of substrate 3, i.e., the diameter and number of throughholes 3a.

With such a combination as described above, the adhesion between substrate 3 and crystal sheet 300 is significantly degraded as substrate 3 moves away from movable member 2 and the second protrusion 2a thus moves away from crystal sheet 300. As such, depending on the condition, crystal sheet 300 being transported can inadvertently remove and thus fall from substrate 8. Such adhesion between substrate 3 and crystal sheet 300, however, can be controlled by optimizing the hole ratio of substrate 3 and the arrangement of throughhole 3a.

In contrast, substrate 3 can have a main surface 3a formed of a more adhesive material with respect to crystal sheet 300 and the second protrusion 2a can have an end formed of a less adhesive material with respect to crystal sheet 300 to prevent the sheet from falling from the substrate.

The substrate 3 main surface 3a and the second protrusion 2a end are also required to have appropriate adhesion property with respect to crystal sheet 300. If substrate 3 has a significant adhesion property with respect to crystal sheet 300 crystal sheet 306 would firmly adhere to substrate 3 and thus hardly be removed therefrom. In contrast, if substrate 3 has a poor adhesion property with respect to crystal sheet 300 then crystal sheet 300 would hardly grow and while it is being transported the sheet might fall and thus would not be collected. As such, substrate 3 is required to have a carefully controlled adhesion property. The second protrusion 2a end and the substrate 3 main surface 30 formed of different materials can significantly readily provide both removability and adhesion property, as appropriate.

Substrate 3 and the second protrusion 2a can be formed of silicon carbide, silicon nitride and boron nitride. These materials can be selected as appropriate depending on the material(s) of the melt and the temperature applied. If the melt is silicon, substrate 3 and the second protrusion 2a are better formed of silicon carbide, silicon nitride or boron nitride.

Furthermore, removability and adhesion property can also be sufficiently controlled by using the above materials to cover only main surface 30 of substrate 3 and an end of the second protrusion 2a of movable member 2, although the second protrusion 2a and main surface 30 are required to be formed of a material having as close a coefficient of thermal expansion as possible to that of thermal expansion of the coating material of interest, since if there is too large a difference between then coefficients of thermal expansion the coating would come off. The coating is not limited to a single layer and it may be formed of multiple layer. Furthermore, such coating can prevent contamination attributed to the second protrusion 2a. It can also facilitate controlling thermal conductivity.

Figure 40:
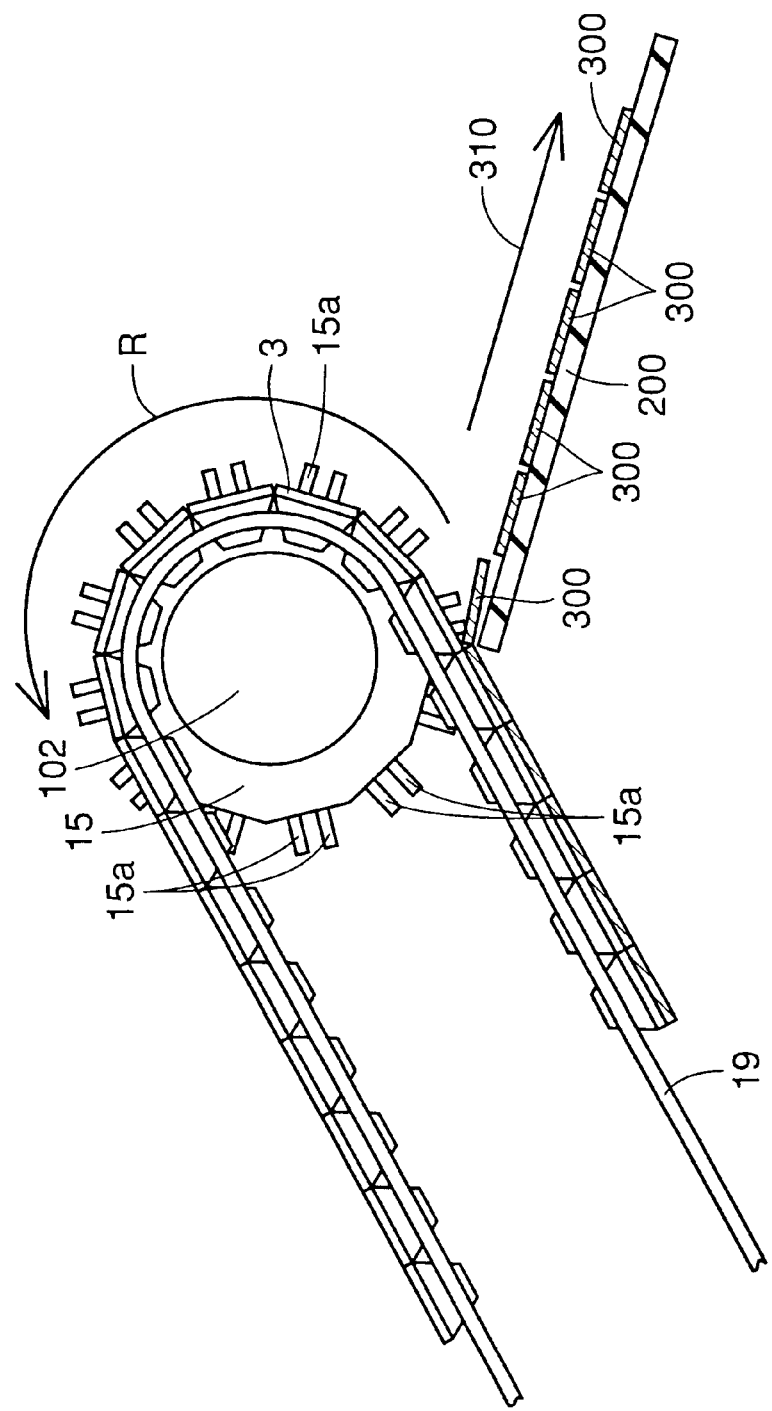
FIG. 40 is a view for illustrating a removal process.

Reference will now be made to FIG. 40 to describe a transport mechanism. Roller 15, serving as removal means, has the first protrusion 15a fit into throughhole 3a of substrate 3. When the first protrusion 15a is fit into the throughhole the first protrusion 15a protrudes from throughhole 3a. Roller 15 is rotatable and the first protrusion 15a is provided in a direction in which roller 15 rotates. Roller 15 can rotate in a direction R.

When the first protrusion 15a is fit into throughhole 3a of substrate 3, crystal sheet 300 is removed from substrate 3. Crystal sheet 300 removed needs to be output outside the apparatus via a transport mechanism. In the present embodiment a guide 200 in the form of an angled slide is used to output the sheet. Thus, crystal sheet 300 moves due to its deadweight or is pushed by crystal sheet 300 subsequently sent out and it thus slides on guide 200 provided in the form of a slide so that it can be carried out of the system. Although it depends on the temperature of the portion to be removed, a conveyer belt can be used to output removed crystal sheet 300. Furthermore, removed crystal sheet 300 may be stored in a chamber to some extent and a plurality of such sheets may be output collectively. In any manner, an air curtain, a 2-stage output chamber or the like is required to seal the crystal-sheet production apparatus.

Sixth Embodiment

Figure 41:
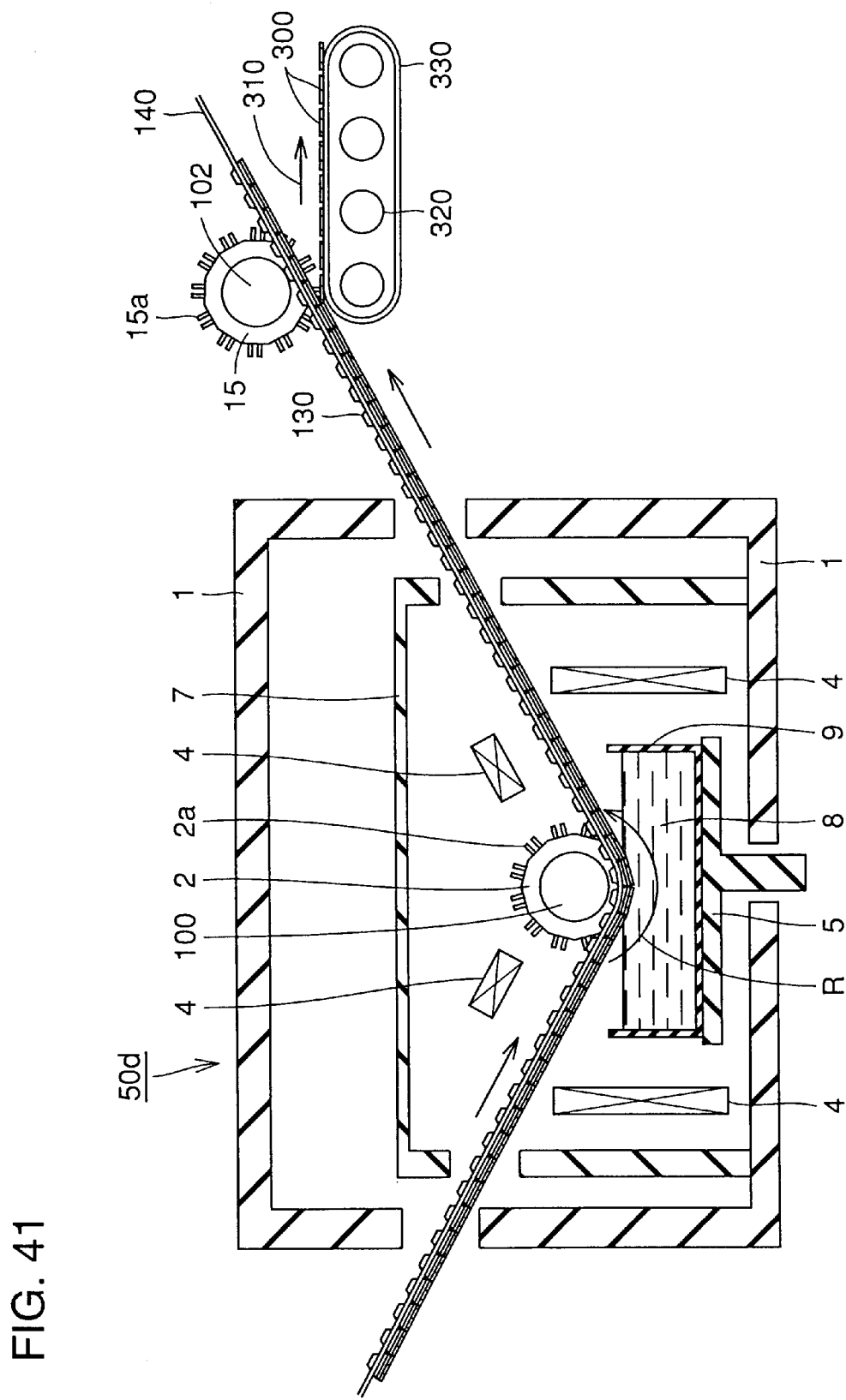
FIG. 41 is a schematic cross section of a crystal sheet production apparatus in a sixth embodiment of the present invention.

With reference to FIG. 41, the present invention in a sixth embodiment provides apparatus 50d for use in producing a crystal sheet, which is distinguished from the apparatus of the fifth embodiment in that substrates 130 are not connected together. A plurality of substrates 130 are not connected together and they slide on a rail 140 serving as a guiding member.

The present embodiment is distinguished from the fifth embodiment in that substrate 130 does rot circulate inside the apparatus but is successively, externally sent in and out. As compared with the fifth embodiment, main chamber 1 has more holes and impurity including air is thus easily introduced into main chamber 1. To prevent this a mechanism is required to seal the chamber with high precision.

Since substrate 130 is output from main chamber 1, substrate 130 experiences a large difference of temperature. This reduces the durability of substrate 130 for continuous use. However, crystal sheet 300 can be removed and subsequently transported at low temperature. This is advantageous in providing high yield. In the fifth embodiment all substrates 3 are strung and if any single substrate 3 is damaged the operation would completely stop, whereas the sixth embodiment provides crystal-sheet production apparatus 50d with substrates 130 simply arranged on rail 140 and not connected together and one or more substrates 130 damaged do not necessarily require the operation to be stopped. Thus, the apparatus is superior in successively producing and mass-producing crystal sheets. Crystal-sheet production apparatus 50d of the sixth embodiment has a main configuration similar to that of the apparatus of the fifth embodiment. More specifically, shaft 100 is internally provided with nozzle 110 serving as a cooling means to cool movable member 2 and substrate 3.

Substrate 130 introduced into the production apparatus slides on rail 140 and thus arrives at movable member 2. The second protrusion 2a of the movable member is fit into a throughhole (not shown in FIG. 41) of substrate 130 to deliver substrate 130. A main surface of substrate 130 is cooled and thus brought into contact with the melt to solidify and grow a component of the melt on the main surface.

Substrate 130 delivered with main surface 133 having a crystal sheet grown thereon is output from the heating chamber and thereafter when it moves past roller 15 a throughhole receives the first protrusion 15a to remove crystal sheet 300 from the main surface. Thereafter, crystal sheet 300 is output by a transport mechanism such as a conveyer belt and crystal sheet 300 can thus be obtained. Note that the conveyer belt is configured of a belt 300 and a roller 320.

If required, substrate 130 is for example washed and/or polished and then again placed on rail 140 and thus successively delivered into crystal-sheet production apparatus 50d.

Figure 42:
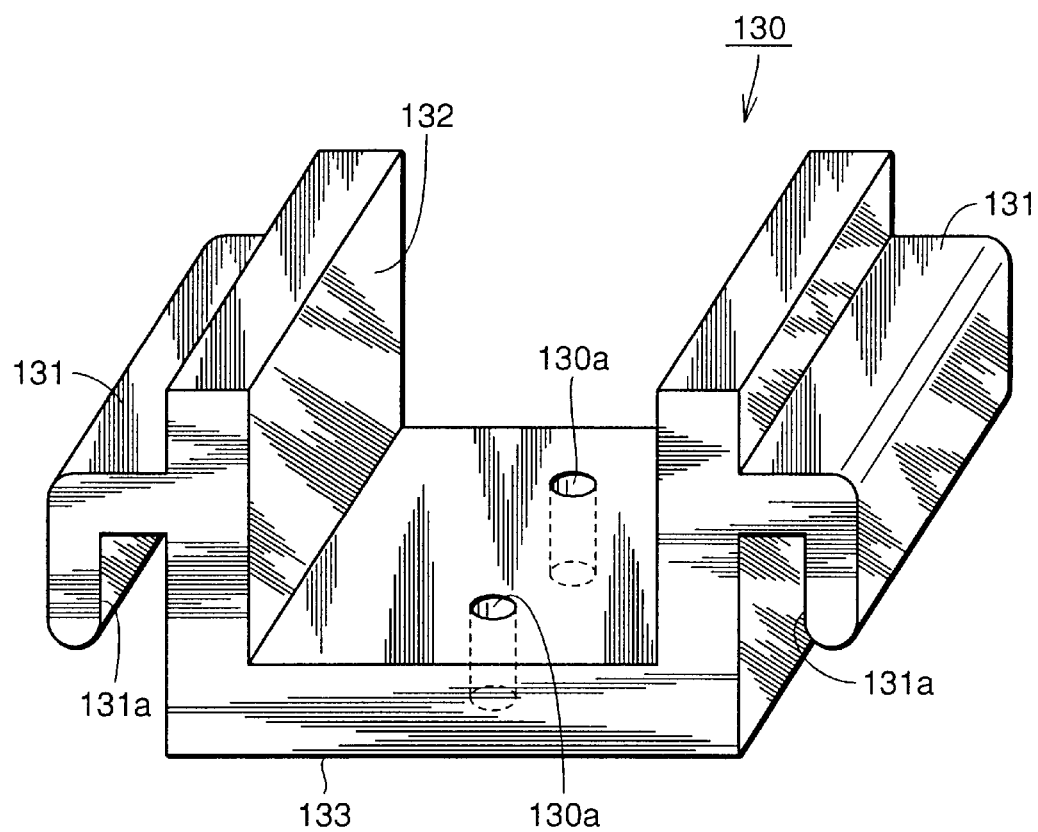
FIG. 42 is a perspective view of a substrate in one aspect of the sixth embodiment.

With reference to FIG. 42, substrate 130 in one aspect has a horseshoe base 132 and a hooked guide 131 formed on either side of base 132. Guide 131 forms a recess 131a into which one of two rails 140 is fit. Substrate 130 fit on rail 140 is successively delivered by gravity, the driving force of movable member 2 and the driving force of roller 15. Base 132 is also provided with a throughhole 130a, with main surface 133 to be immersed into a melt.

Figure 43:
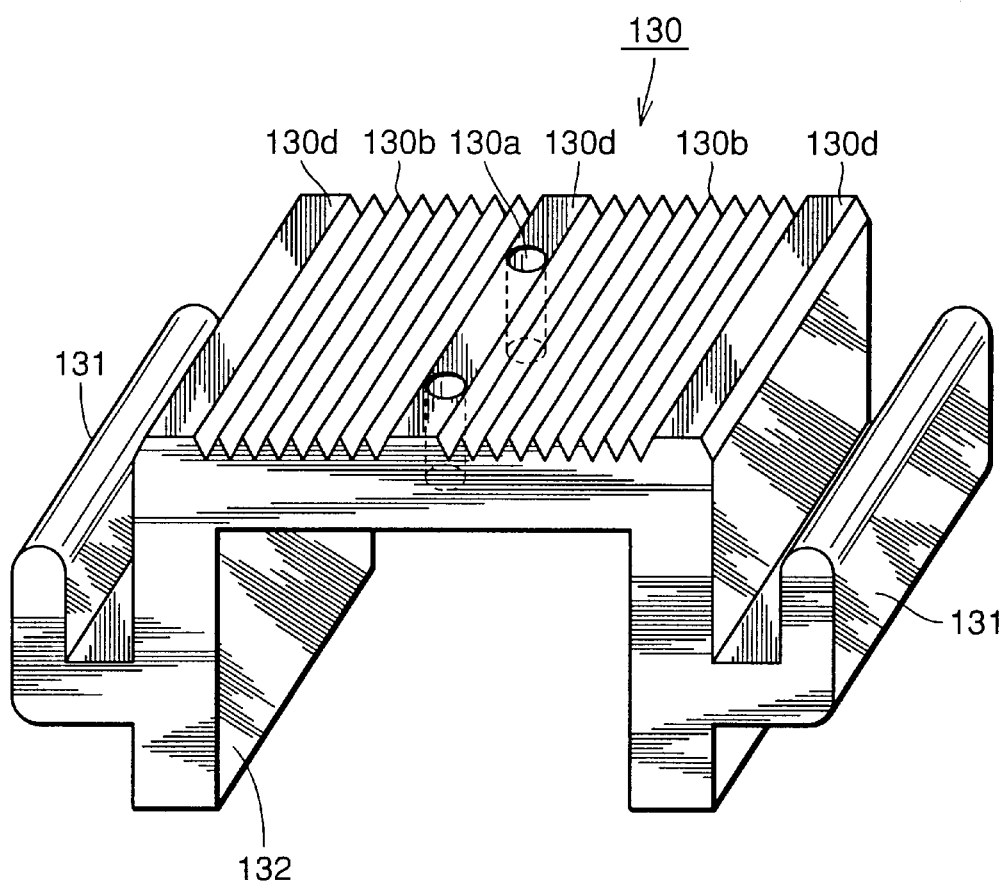
FIG. 43 is a perspective view of a substrate in another aspect of the sixth embodiment.
Figure 44:
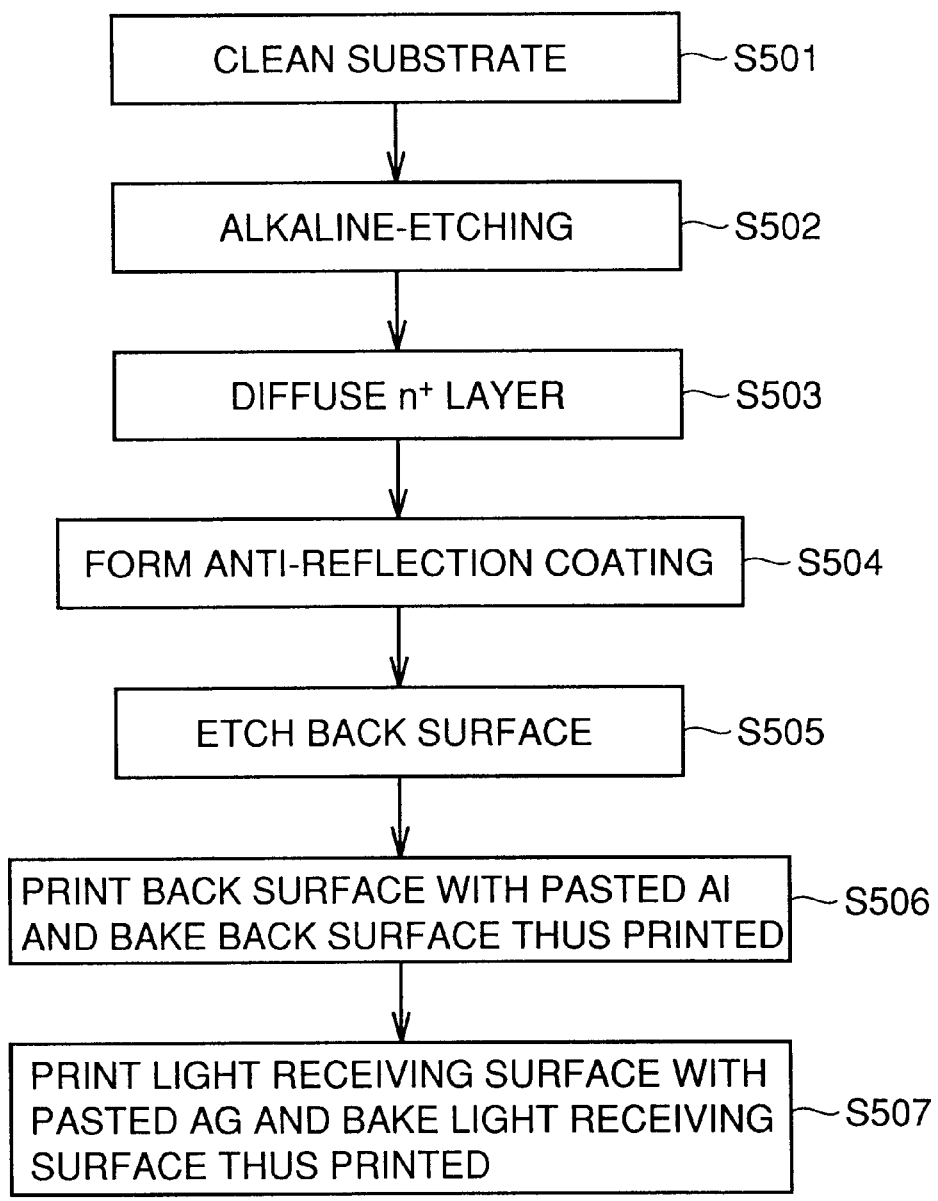
FIG. 44 is a flow chart of a process for fabricating a solar cell.

Furthermore, as shown in FIG. 43, substrate 130 can have a surface provided with a linear protrusion 130b and a pointed protrusion (not shown in FIG. 43) and a planar protrusion 130d. This substrate 130 surface can be unleveled as shown in FIGS. 20–23. It can also have a throughhole in the form of a truncated cone, a prism or the like. The geometry, diameter and number of throughholes 130a, the presence/absence of a flat portion, the material covering a protrusion, and the like may be selected and used as appropriate.

In the present invention as above, a transport mechanism can move a substrate and subsequently a crystal sheet can be successively removed from the substrate. In the present invention, a significantly simple mechanism can be used to remove a crystal sheet from a substrate. As such, neither completed facility nor control are required and a crystal sheet can thus be removed through an inexpensive process.

Furthermore, while mainly in a vicinity of the melt the apparatuses are exposed to significantly high temperature and they are thus required to have their respective mechanisms resistant to high temperature, the successive removal mechanism of the present invention hardly requires any mechanical movable portion. As such, the apparatus can also reliably continue to operate at high temperature.

The number of the first protrusions for removal is not required to be equal to that of throughholes of the substrate of interest and it may be any number no more than that of the throughholes of the substrate. This can reduce the number of protrusions corresponding to a portion having a low level of mechanical strength for high temperature. Furthermore, if a protrusion is damaged in production of a crystal sheet, the crystal sheet still can be removed if at least one protrusion remains. Thus the present invention can provide a removal mechanism contributing a high yield.

Furthermore in the present invention a surface of a substrate that corresponds to a surface used to grow a crystal sheet can be planarized and a flat crystal sheet can thus be grown on the substrate surface. Thus, a portion required to provide good contact, such as an electrode ground portion, can be planarized. Furthermore, planarizing a substrate with protrusion and recess of approximately 80 $\mu$m allows transportation through such a process as vacuum chucking. This can significantly contribute to reducing the cost of the process and increasing yield.

Furthermore the movable member can have the second protrusion increased or decreased in level relative to the substrate thickness to allow the substrate surface to have a crystal-sheet growth surface provided with a recess or a protrusion to provide a crystal sheet shaped as desired. Furthermore, to remove a crystal sheet from a substrate the first protrusion for removal is required to be higher in level than the second protrusion. Simultaneously, setting the level of the first protrusion for removal to be approximately 105 to 120% of that of the second protrusion, can reduce the height of the first protrusion for removal to a minimal value. The first protrusion has a low level of mechanical strength for high temperature. As it is increased in height it is reduced in mechanical strength. Setting the height of the first protrusion to have a minimal value can enhance the apparatus durability and increase the yield of the crystal-sheet production apparatus in the present invention.

Furthermore in the present invention an end of the second protrusion and a main surface of the substrate can be formed of different materials to allow a single, crystal-sheet growth surface to be formed of materials having a plurality of different adhesion properties. Furthermore, in the present invention, unleveling a surface of a substrate can provide a crystal sheet having a surface closer to the substrate that is unleveled as desired. As such, a crystal sheet can have a surface with any desired portion unleveled as desired such as in the form of a pyramid, a V-letter recess or the like. If a crystal sheet for use in conjunction with a solar cell, the crystal sheet can have a surface partially unleveled for light confinement and it can also have an electrode ground portion with a contact plane planarized to provide good contact between an electrode and the crystal sheet.

The present invention can address a significant issue of a solar cell, i.e., reducing the cost thereof. More specifically, yield can be increased by reducing a loss of a source material, reducing the cost for slicing and controlling removability. Furthermore, polishing, grooving and other processes can be dispensed with in unleveling a surface of a crystal sheet, as desired. Furthermore, temperature profile can be controlled to control creation of a crystal nucleus to improve the quality of the crystal.

Examples

Hereinafter the examples of the present invention will be specifically described. It should be noted that in the following examples the melt is provided in the range of 1430 to 1450° C. and the movable member revolves at 0.1 to 20 r.p.m. The cooling gas applied has a flow rate of 0 to 800 dm$^3$ per minute.

Movable member 2 and substrate 3 are shaped as shown in FIGS. 14 and 28–30. Furthermore, substrate 3 has a surface with a hole ratio (a ratio of the area of throughhole 3a to that of main surface 30) of 5 to 75%. In each example the second protrusions 2a height is greater than, less than and equal to the substrate 3 thickness. Each experiment is conducted with an end of the second protrusion 2a and a surface of substrate 3 coated with a layer and those not coated with a layer. If the coating layer is applied it is formed of silicon carbide, silicon nitride or boron nitride. A crystal sheet obtained from each example is used to fabricate a solar cell through a simple process.

First Example

Initially, crystal-sheet production apparatus 50c as described in the fifth embodiment is used to produce a crystal sheet 50 substrates 3 are connected together to form a circulating system. The system is circulated substantially once to conduct an experiment. The experiment is conducted under the conditions ranged as described above. Detail conditions and procedures are provided as described below.

Initially, movable, member 2 is prepared having the second protrusion 2c as shown in FIG. 17. Furthermore, substrate 3 is also prepared having a throughhole corresponding in geometry to the second protrusion 2c. Substrate 3 has a surface with a hole ratio of 50%. Substrate 3 has main surface 30 covered with silicon nitride. The second protrusion 2c has an end that is not particularly covered. Furthermore, substrate 3 has a flat surface for glowing a crystal sheet. That is, the surface is not recessed. A mass of 10 kg of a source material of silicon (of 99.999999999% pure) is introduced into a crucible formed of highly pure graphite. The chamber is vacuumed to have an internal pressure of 6.7×10$^{-3}$ Pa. Gaseous argon is introduced into the chamber to provide atmospheric pressure therein. Thereafter, at 10 dm$^3$ per minute the gaseous argon continues to flow from an upper portion of the chamber.

Then, the chamber is internally heated to 1500° C. to completely melt the silicon. Furthermore, the source material of silicon is additionally introduced to set the liquid level at a predetermined level. Then, the chamber is internally cooled to 1430° C. and thus maintained for 30 minutes to stabilize the temperature of the chamber's interior and the temperature of melted silicon 8. Then, while the FIG. 13 movable member 2 is revolved at 0.5 r.p.m. movable member 2 internally receives gaseous nitrogen serving as a cooling gas at 700 dm$^3$ per minute to internally cool movable member 2. Then, crucible 9 is gradually elevated to immerse movable member 2 into melt 8 of silicon, while the circulating system is circulated substantially once. Simultaneously, a sheet of crystallized silicon is grown on a main surface of substrate 3. Substrate 3 is successively sent out from movable member 2 and at roller 15 the sheet of crystallized silicon is removed from substrate 3.

Initially, the sheet of crystallized silicon produced through the above process (the substrate) is washed (step S 501). Then, alkaline etching is employed to etch the sheet of crystallized silicon (step S502). In the crystal sheet an n layer is formed through diffusion (step S503). The crystal sheet is provided on a surface thereof with an anti-reflection coating (step S504). The crystal sheet has a back surface thereof etched (step S505). The crystal sheet has the back surface printed with pasted aluminum and it is thus baked (step S506). Its light receiving surface is printed with pasted silver and it is thus baked (step S507). Thus a solar cell is fabricated. This solar cell is set to have a longitudinal dimension of 2 cm and a lateral dimension of 2 cm. The solar cell's conversion efficiency as measured is 12%.

SECOND EXAMPLE

In this example, the apparatus of the sixth embodiment is used to produce a crystal sheet. Substrate 130 is successively delivered and 60 substrates 130 are thus immersed into melt 8 to produce a crystal sheet under conditions similar to those applied in the first embodiment. The obtained crystal sheet is used to fabricate a solar cell and a result similar to that of the first embodiment is obtained.

THIRD TO SIXTH EXAMPLES

Third to sixth examples are provided in a manner similar to that as employed in the first embodiment, except that substrate 3 has an unleveled surface. More specifically, the third example employs the FIG. 20 substrate 3. The fourth example employs the FIG. 21 substrate. The fifth example employs the FIG. 22 substrate. The sixth example employs the FIG. 23 substrate. Each substrate has a recess of 1 mm in pitch and 1 mm in depth. In FIGS. 22 and 23, planar protrusion 3d is 5 mm wide. Each substrate 3 is employed to fabricate a solar cell, which exhibits characteristics, as shown in Table 1.

TABLE 1

|  | short-circuit current (mA/cm$^2$) | open-circuit voltage (mV) | fill factor | conversion efficiency of cell (%) |
| --- | --- | --- | --- | --- |
| Example 3 | 28.4 | 580 | 0.71 | 11.7 |
| Example 4 | 29.5 | 581 | 0.72 | 12.3 |
| Example 5 | 29.4 | 585 | 0.75 | 12.9 |
| Example 6 | 29.6 | 585 | 0.73 | 12.6 |

SEVENTH EXAMPLE

Initially, a source material of silicon is prepared with boron having a concentration adjusted to provide a specific resistance of 2Ω·cm. The source material of silicon is introduced into a crucible of quartz protected by a crucible of highly pure carbon. The crucible was fixed internal to main chamber 1 shown in FIG. 41. Main chamber 1 is vacuumed to no more than 6.7×10$^{-1}$ Pa in pressure. Thereafter, the gaseous argon is introduced into main chamber 1 to provide atmospheric pressure. Thereafter, the gaseous argon is allowed to flow out constantly at 1 dm$^3$ per minute from an upper portion of the chamber.

Then, to melt the silicon, heater 4 is set to 1550° C. Thus, the silicon is completely melted. Since the source material of silicon has been melted and its liquid level is thus lowered, the source material of silicon is additionally introduced through a tube introducing additional source material to maintain the liquid level at a predetermined level. Then, the melt of silicon is maintained at 1450° C. for 30 minutes to stabilize the temperature of the melt.

Then, with movable member 2 still nor rotated, gaseous nitrogen having a flow rate of 700 dm³/min. is sprayed to and thus cools movable member 2. Substrate 130 used herein has a surface provided with linear protrusion 130b and planar protrusion 130d as shown n FIG. 43. Substrate 130 has throughhole 130a provided in planar protrusion 130d. Linear protrusion 130b has a pitch of 0.5 mm and planar protrusions 130d has a width of 2 mm. Substrate 130 has peripheral dimensions of 30 mm×30 mm. Then, crucible 9 is gradually elevated until substrate 130 has a surface immersed into the melt 5 mm deep. Movable member 2 is rotated at 5 r.p.m to produce a sheet of crystallized silicon.

Then, substrate 130 is successively input and substrate 130 with a sheet of crystallized silicon grown thereon is also successively delivered. Then, substrate 130 together with the sheet is output from main chamber 1 and, with roller 15 for removal also rotated, sheet of crystallized silicon 300 is removed from substrate 130. The obtained sheet of crystallized silicon 300 can be readily removed from substrate 130.

Sheet of crystallized silicon 300 substantially matches substrate 130 in size having a longitudinal dimension of 30 mm and a lateral dimension of 30 mm. The obtained sheet of crystallized silicon 300 has a thick portion of approximately 0.4 mm and a thin portion of approximately 0.25 mm in thickness.

Then, the obtained sheet of crystallized silicon 300 is used to fabricate a solar cell. The obtained sheet of crystallized silicon is etched with a solution of a mixture of nitric acid and hydrofluoric acid and washed and then alkaline-etched with sodium hydroxide. Then, $POCl_3$ is diffused to form an n-type layer in a p-type substrate. PSG (phosphorus silicate glass film) formed on a surface of the crystal sheet is removed with hydrofluoric acid and plasma CVD is then employed to form film of silicon nitride on an n-type layer serving as a light receiving surface of the solar cell. Then, an n-type layer formed on a surface that will serve as a back surface of the solar cell, is etched away with a solution of a mixture of nitric acid and hydrofluoric acid. Thus, the p-type substrate is exposed. Thereon, a back electrode and a $p^+$ layer are simultaneously formed.

Then, an electrode on the side of the light receiving plane is formed, screen-printed. As shown in FIG. 25, it is so screen-printed that it is formed on the sheet of crystallized silicon at a flat portion. Then, sold-dipping is employed to fabricate the solar cell. The fabricated solar cell is irradiated with an AM of 1.5 at 100 mW/cm² to measure its characteristics. The result of the measurement is a short-circuit current of 29.8 mA/cm², an open-circuit voltage of 594 mV, a fill factor of 0.73 and an efficiency of 12.9%.

EIGHTH EXAMPLE

In the present example a sheet of nickel is produced. A source material of nickel is introduced into crucible 9 of highly pure alumina which is fixed in a chamber of the FIG. 13 apparatus 50c for use in producing a crystal sheet. The chamber is set to have an internal pressure of no more than $6.7\times10^{-2}$ Pa. Then, gaseous argon is introduced into the chamber to achieve atmospheric pressure. Thereafter, at a constant rate of 1 dm³/min. the gaseous argon is allowed to flow out from an upper portion of the chamber Then a heater for melting the nickel is set to have a temperature of 1560° C. to completely melt the nickel. The source material of nickel melted has a lowered liquid level. Accordingly, the source material of nickel is additionally introduced through a tube for introducing additional source material to set the liquid level at a predetermined level. Then, melt 8 of nickel is maintained at 1470° C. for 30 minutes to stabilize the temperature of melt 8.

Then with movable member 2 rotating at 5 r.p.m. gaseous nitrogen having a flow rate of 1400 dm³/min. is sprayed to an interior of movable member 2 to cool movable member 2. Substrate 3 used herein has a surface provided with pointed protrusion 3c as shown in FIG. 21. Pointed protrusion 3c has a pitch of 0.07 mm with a recess of 0.07 mm in depth. Substrate 3 has peripheral dimensions, 20 mm in longitudinal dimension and 20 mm in lateral dimension.

Then, crucible 9 is gradually elevated until substrate 3 is immersed into the melt 5 mm deep. Thus a sheet of nickel is produced. The obtained sheet of nickel has a thick portion of 600 μm and a thin portion of 400 μm in thickness.

NINTH EXAMPLE

In the present example, a sheet of aluminum is produced. A source material of aluminum is introduced into crucible 9 made of highly pure graphite. Crucible 9 is then fixed in a chamber of the FIG. 13 apparatus 50c for use in producing a crystal sheet. The chamber is set to have a pressure of no more than 1.3 Pa. Then, gaseous argon is introduced into the chamber to achieve atmospheric pressure. Thereafter, at a constant flow rate of 0.5 dm³/min. the gaseous argon is allowed to flow out from an upper portion of the chamber.

Then the heater temperature is set at 800° C. to completely melt the aluminum. The source of aluminum melted has a lowered liquid level. Accordingly, the source material of aluminum is additionally introduced through a tube for introducing additional source material to set the liquid level at a predetermined level.

Then, the melt of aluminum is maintained at 700° C. for five minutes to stabilize the temperature of the melt.

Then, with movable member 2 rotating at 10 c.p.m. gaseous nitrogen having a flow rate of 800 dm³/min. is sprayed to an interior of movable member 2 to cool movable member 2. Substrate 3 used herein has linear protrusion 3b as shown in FIG. 20. Protrusion 3b has a pitch of 0.07 mm with a recess of 0.07 mm in depth. Substrate 3 has peripheral dimensions of 15 mm in longitudinal dimension and 15 mm in lateral dimension.

Then, crucible 9 is gradually elevated until substrate 3 is immersed into the melt 5 mm deep to produce a sheet of aluminum.

A sheet thus obtained has a thick portion of 300 μm and a thin portion of 150 μm in thickness.

TENTH EXAMPLE

Figure 45:
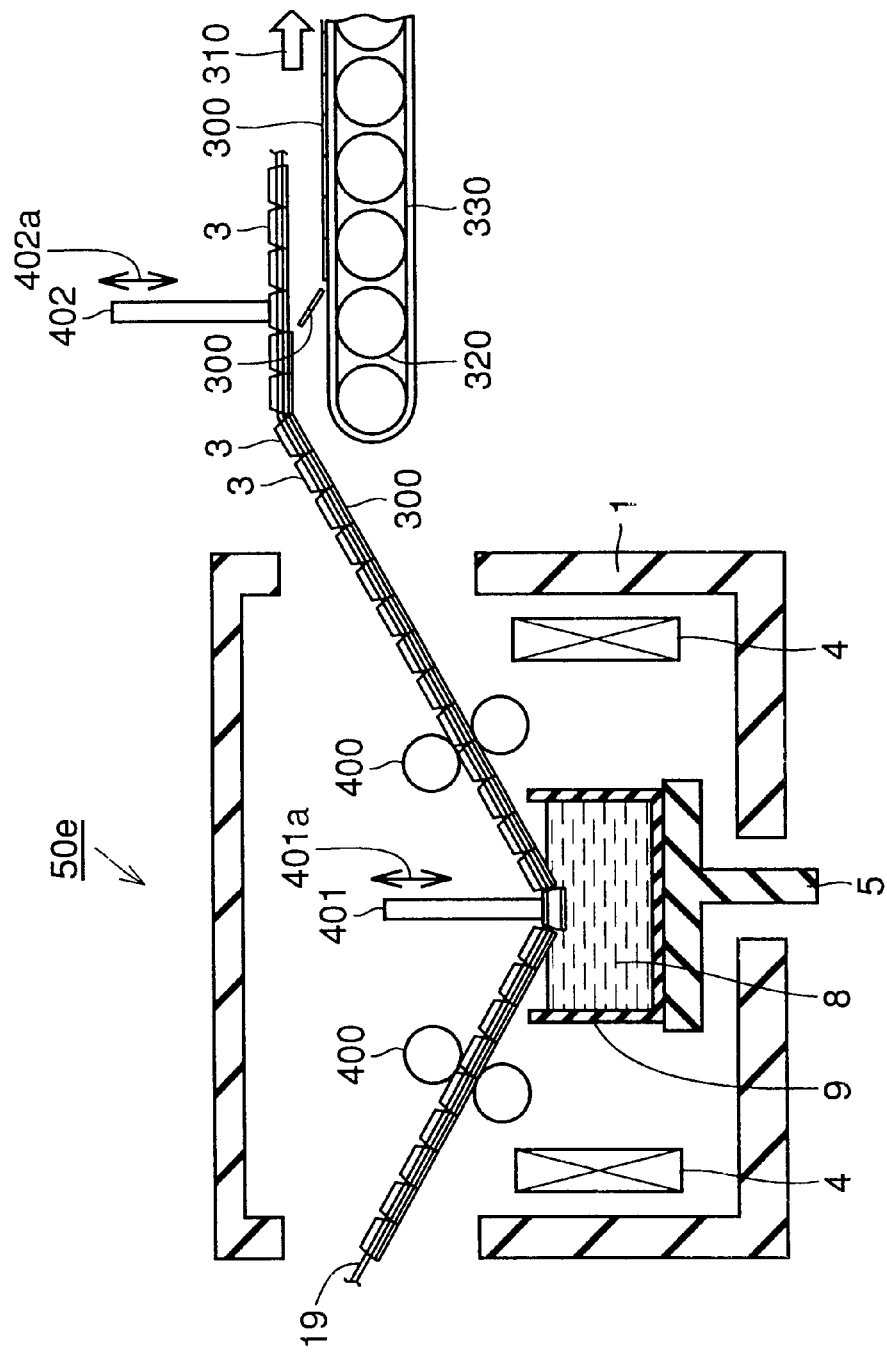
FIG. 45 is a schematic cross section of a crystal sheet production apparatus used in a tenth embodiment.

In the present example, the FIG. 45 apparatus is used with the same conditions as applied in the seventh example except for crystal-sheet production apparatus 50e, to produce a sheet of crystallized silicon. With reference to FIG. 45, in the present embodiment neither a removal means 402 nor a movable member 401 rotate. Removal means 402 and movable member 401 vertically move in directions 402a and 401a, respectively.

Figure 46:
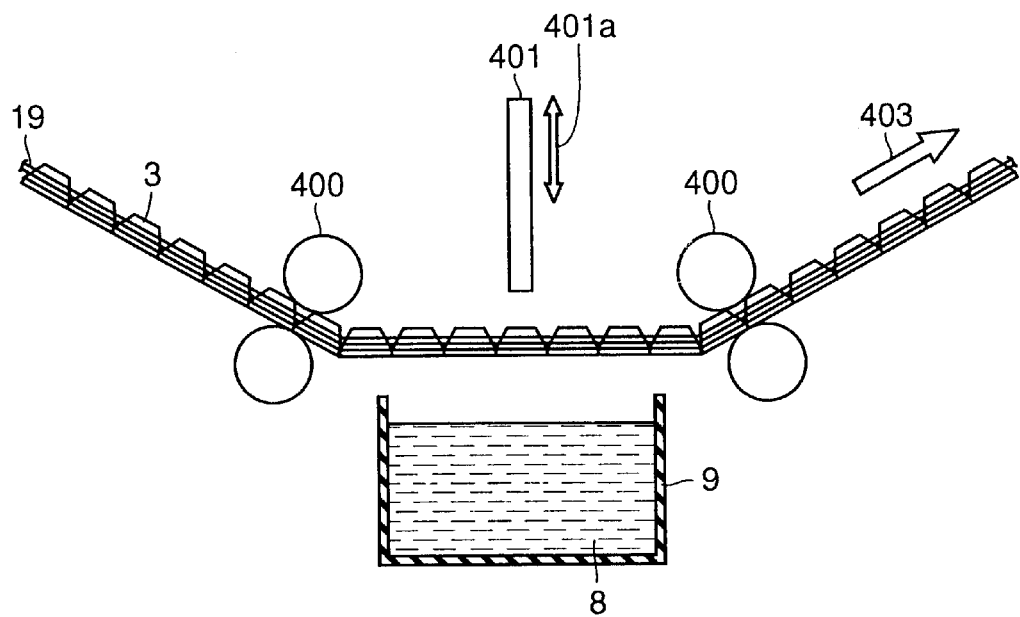
FIGS. 46 and 47 are views for illustrating an operation of the FIG. 45 apparatus.

Movable member 401 will initially be described. With reference to FIG. 46, guiding member 19 in the form of a belt successively delivers substrates 3 connected in the form of a caterpillar. A tension roll 400 applies a level of tension to the caterpillar. Movable member 401 is internally provided with a nozzle serving as a cooling means. The nozzle jets a cooling gas to cool movable member 401 and substrate 3 brought into contact with movable member 401.

Figure 47:
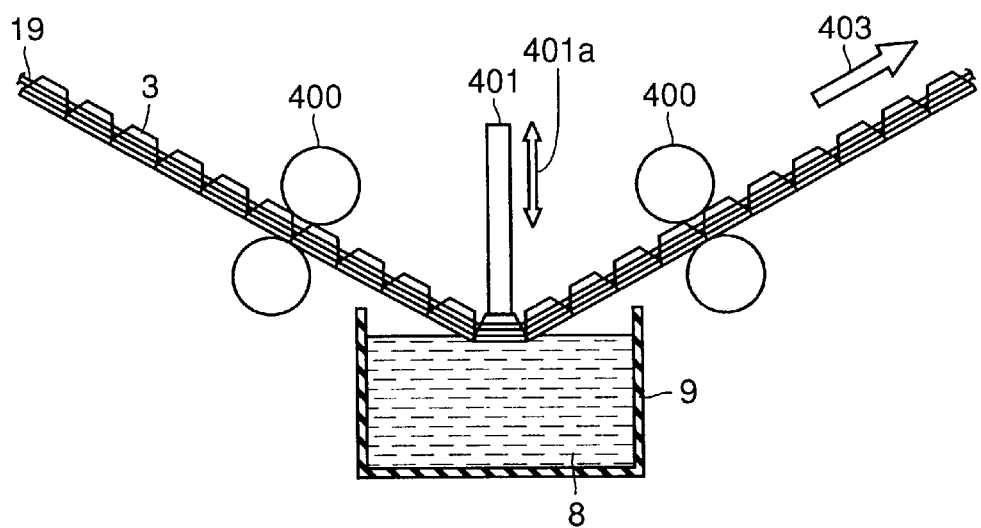

Then, with reference to FIG. 47, movable member 401, which does not rotate, pushes substrate 3 downward to immerse substrate 3 into melt 8 of silicon. Then, movable member 401 ascends to a position as shown in FIG. 46. A single substrate 3 is sent in a direction 403 and movable member 401 then descends to immerse a subsequent substrate 3 into the melt. This series of operations is repeated to allow sheets of silicon to be produced successively.

Figure 48:
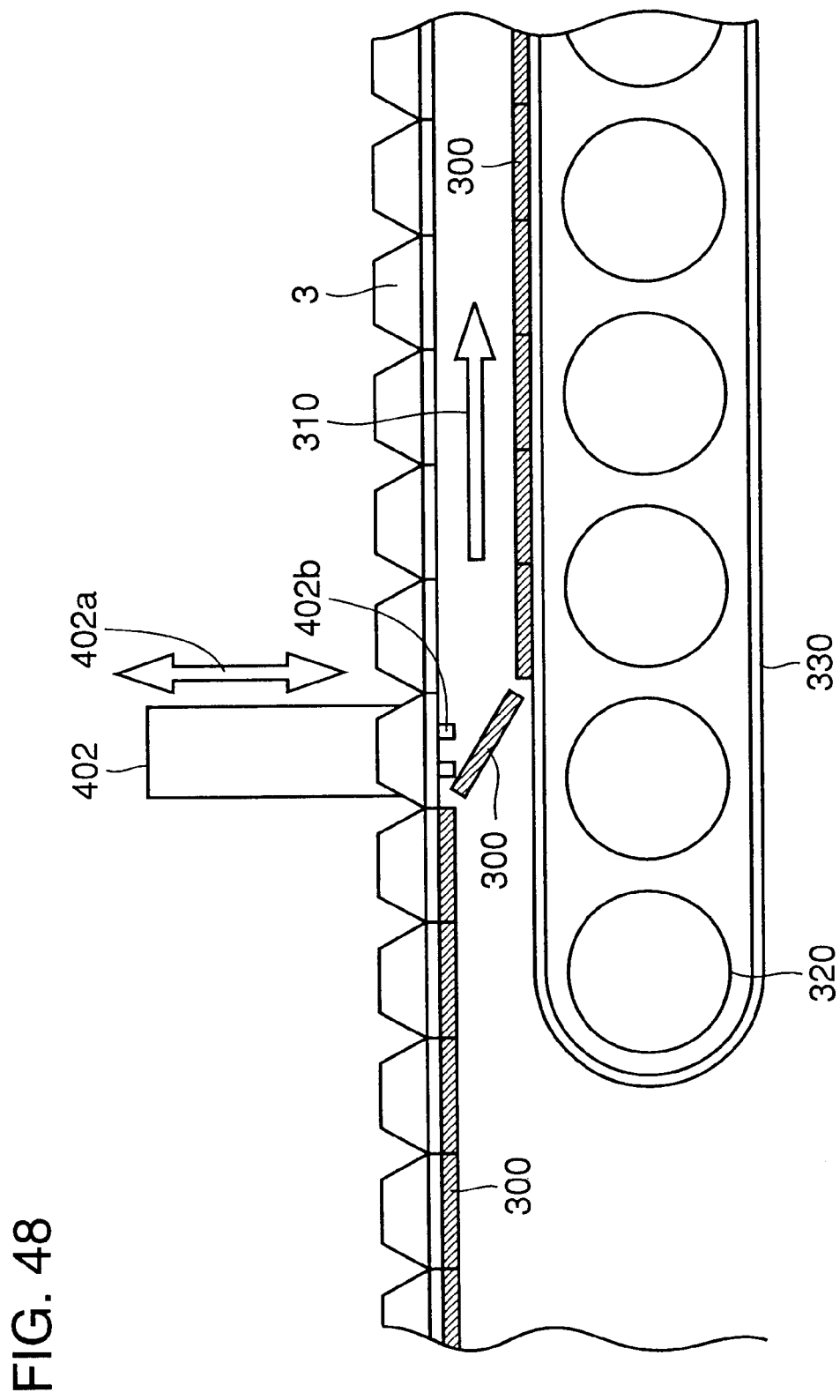
FIG. 48 is a view for illustrating an operation of a removal means.
Figure 49:
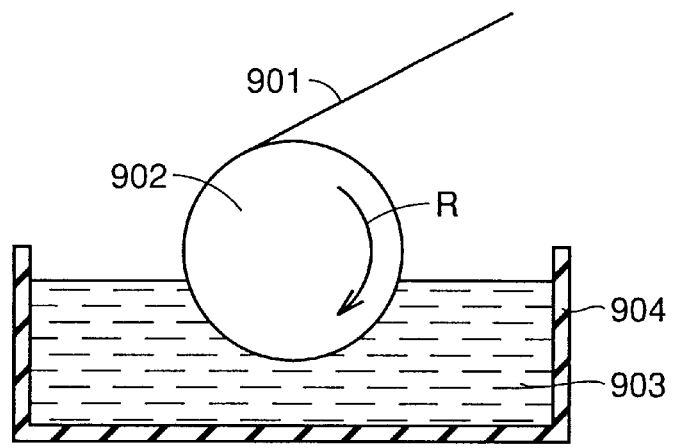
FIG. 49 schematically shows a method of producing silicon in a conventional silicon ribbon method.
Figure 50:
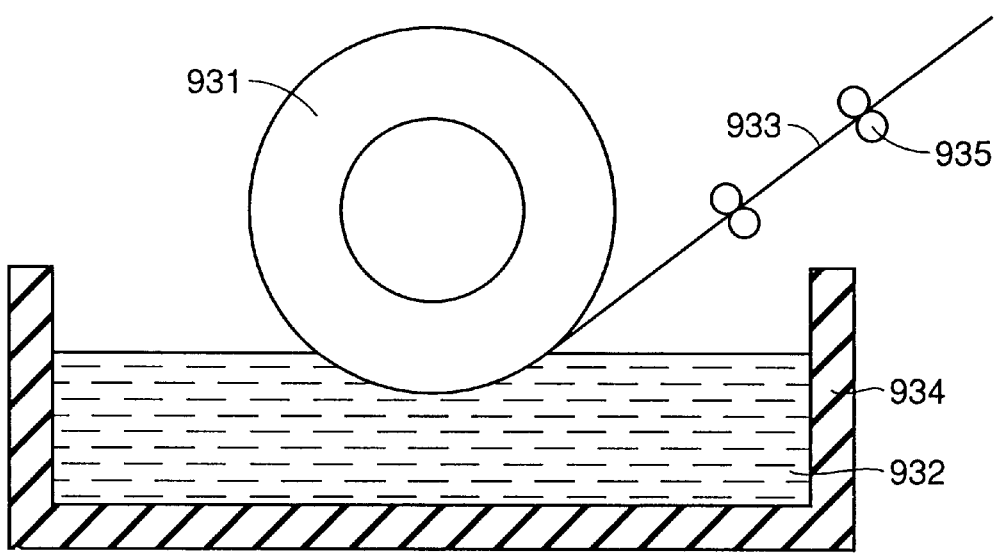
FIG. 50 is a schematic view of a conventional silicon ribbon production apparatus.

Removal means 402 will now be described. Substrates 3 connected in the form of a caterpillar are similarly, successively introduced. Removal means 402 vertically moves to remove crystal sheet 300 from substrate 3 and a conveyer belt 330 is used to transport and thus output crystal sheet 300 in a direction 310. While a single removal means 402 suffices, as shown in FIG. 48, more than one removal means 402 can also be used to similarly efficiently output crystal sheet 300.

Furthermore, to continue to successively move substrate 3, movable member 401 and removal means 402 are desirably also movable in synchronization with substrate 3 in a direction in which substrate 3 moves. Note that removal means 402 has a protrusion 402b. Furthermore, in FIG. 48, guiding member 19 is not shown Although the present invention has been described and illustrated in detail, it is clearly understood that the same is by way of illustration and example only and is not to be taken by way of limitation, the spirit and scope of the present invention being limited only by the terms of the appended claims.

In the present invention a substrate can be brought into contact with a cooled movable member and as the substrate is thus cooled a crystal sheet can be grown to prevent the substrate and the melt from reacting with each other, to provide a crystal sheet having a planar geometry corresponding to the substrate. Furthermore, substrates connected in the form of a caterpillar can have a portion brought into contact with a cooling element for crystal growth and the substrates together with crystal can be transported and output from the heating chamber to facilitate transporting and thus outputting them from the heating chamber. Furthermore, removing and collecting a crystal sheet outside the heating chamber can also facilitate removing the crystal sheet from a substrate. Furthermore, a collecting jig such as a vacuum chuck can be arranged in an area of low temperature. As such, it is not necessary to consider its refractoriness. This can facilitate designing the apparatus. Furthermore, substrates can be successively fed to the cooling element to produce crystal sheets more efficiently.

Furthermore, substrates can be connected in the form of a caterpillar via a connection prevented from being immersed into tie melt. This can prevent any damage attributable to the melt permeating into a movable portion.

Furthermore, the movable member serving as a cooling element and the substrate can contact with each other via an unleveled plate. Thus, the movable member can contact the substrate over a large area to efficiently cool the substrate.

Furthermore, a substrate arranged around the movable member can be provided with a throughhole and the movable member can be correspondingly provided with a protrusion to successively remove a crystal sheet from the substrate. Since any mechanically movable portion is hardly required, reliable operation can be achieved even at a high temperature such as when a melt of silicon is used.

Furthermore, the protrusion as described above allows production of a crystal sheet unleveled as desired. As such, a crystal sheet to be produced can be generally determined in geometry to eliminate a step in processing a crystal sheet to reduce the cost therefor. Furthermore, a surface of the substrate and an end of the, protrusion can be covered with more than one, different types of materials having different adhesion properties with respect to a crystal sheet to facilitate controlling the adhesion between the substrate and the crystal sheet.

What is claimed is:

1. A method of producing a crystal sheet, the method comprising:

bringing a main surface of a cooled plate into contact with a melt;

moving away from the melt the main surface of said plate brought into contact with the melt, to solidify and grow a crystal sheet on said main surface;

removing the crystal sheet from said plate; and wherein the step of removing the crystal sheet from the plate includes guiding the crystal sheet grown on said plate to output the crystal sheet from a heating chamber, and removing the crystal sheet from said plate and collecting the crystal sheet so that the crystal sheet is removed from the plate outside of the heating chamber.

2. The method of claim 1, wherein the step of moving includes using a movable member to bring said main surface of said plate into contact with the melt, and then moving said plate away from the melt.

3. The method of claim 2, wherein said plate is guided by a guiding member in a form of a belt from said movable member, said guiding member allowing more than one said plate to be connected together in a form of a caterpillar.

4. The method of claim 2, wherein said plate is guided by a guiding member in a form of a rail from said movable member.

5. The method of claim 2, wherein the movable member includes first and second protrusions, and wherein the step of bringing includes using said movable member to bring said plate into contact with the melt with said second protrusion fit into a throughhole defined in the plate.

6. The method of claim 5, said movable member being rotatable, said movable member being provided with more than one said second protrusion in a direction in which said movable member rotates, wherein the step of bringing includes rotating said movable member to fit each of more than one said second protrusion into each said throughhole of more than one said plate to bring said plate into contact with the melt.

7. The method of claim 1, wherein the plate is provided with a throughhole defined therein, and wherein the step of removing includes using removal means provided with a first protrusion to be inserted into said throughhole of said plate from a side of said plate opposite to said main surface of said plate with a crystal sheet thereon to remove the crystal sheet from said plate.

8. The method of claim 7, said removal means being rotatable, said removal means being provided with more than one said first protrusion in a direction in which said removal means rotates, wherein the step of removing includes rotating said removal means to fit said more than one said first protrusion into at least one said throughhole of each of more than one said plate to remove the crystal sheet from said plate.

9. The method of claim 1, wherein the step of moving includes solidifying a melt of silicon and thus growing a sheet of crystallized silicon.

10. The method of claim 1, wherein the step of bringing includes moving said cooled plate from a horizontal surface of the melt to an inner portion of the melt to immerse said cooled plate in the melt.

* * * * *